United States Patent
Ikeda et al.

(10) Patent No.: US 7,348,711 B2
(45) Date of Patent: Mar. 25, 2008

(54) PIEZOELECTRIC/ELECTROSTRICTIVE ELEMENT, METHOD OF MANUFACTURING PIEZOELECTRIC/ELECTROSTRICTIVE ELEMENT, PIEZOELECTRIC/ELECTROSTRICTIVE DEVICE, AND METHOD OF MANUFACTURING PIEZOELECTRIC/ELECTROSTRICTIVE DEVICE

(75) Inventors: Koji Ikeda, Hisai (JP); Kazuyoshi Shibata, Mizunami (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/263,027

(22) Filed: Oct. 31, 2005

(65) Prior Publication Data
US 2006/0061237 A1    Mar. 23, 2006

Related U.S. Application Data

(63) Continuation of application No. PCT/JP2004/007837, filed on Jun. 4, 2004.

(30) Foreign Application Priority Data

Jun. 6, 2003    (JP)    ............... 2003-162694

(51) Int. Cl.
*H01L 41/08* (2006.01)
(52) U.S. Cl. ...................... 310/328; 310/366
(58) Field of Classification Search ............... 310/328, 310/332, 363–366
See application file for complete search history.

(56) References Cited

U.S. PATENT DOCUMENTS

| | | | | |
|---|---|---|---|---|
| 5,233,260 A | * | 8/1993 | Harada et al. | 310/328 |
| 5,459,371 A | * | 10/1995 | Okawa et al. | 310/363 |
| 5,745,278 A | * | 4/1998 | La Fiandra | 359/224 |
| 6,498,419 B1 | * | 12/2002 | Takeuchi et al. | 310/321 |
| 6,573,639 B1 | * | 6/2003 | Heinz et al. | 310/363 |
| 6,765,337 B1 | * | 7/2004 | Heinz et al. | 310/328 |
| 6,891,313 B1 | * | 5/2005 | Henneken et al. | 310/328 |

FOREIGN PATENT DOCUMENTS

| | | |
|---|---|---|
| JP | 03-185884 A1 | 8/1991 |
| JP | 08-264491 A1 | 10/1996 |
| JP | 10-290031 A1 | 10/1998 |
| JP | 2001-210887 A1 | 8/2001 |
| JP | 2002-140995 A1 | 5/2002 |

* cited by examiner

*Primary Examiner*—Mark Budd
(74) *Attorney, Agent, or Firm*—Burr & Brown

(57) ABSTRACT

In piezoelectric/electrostrictive elements, electrode layers have respective ends projecting outwardly from an end face of a piezoelectric/electrostrictive layer on a side surface where the laminated state of the piezoelectric/electrostrictive layer and the electrode layers is exposed. The distance by which the ends project outwardly from the end face is equal to or smaller than one half of the thickness of the piezoelectric/electrostrictive layer between the electrode layers. The distance is preferably in a range from 0.5 μm to 2 μm.

7 Claims, 15 Drawing Sheets

PIEZOELECTRIC/ELECTROSTRICTIVE ELEMENT, METHOD OF MANUFACTURING PIEZOELECTRIC/ELECTROSTRICTIVE ELEMENT, PIEZOELECTRIC/ELECTROSTRICTIVE DEVICE, AND METHOD OF MANUFACTURING PIEZOELECTRIC/ELECTROSTRICTIVE DEVICE

BACKGROUND OF THE INVENTION

1. Field of the Invention

The present invention relates to a laminated piezoelectric/electrostrictive element having a structure in which a piezoelectric/electrostrictive layer and electrode layers are stacked in an interdigitating comb-shaped pattern, a method of manufacturing the piezoelectric/electrostrictive element, a piezoelectric/electrostrictive device having the above laminated piezoelectric/electrostrictive element, and a method of manufacturing the piezoelectric/electrostrictive device.

2. Description of the Related Art

A piezoelectric/electrostrictive device such as an actuator element or a sensor element using a piezoelectric/electrostrictive layer is produced as follows. A wiring pattern made of a first electrode layer is formed on a ceramic substrate by printing, for example. A piezoelectric/electrostrictive layer is further formed thereon by printing, followed by sintering to fix the layer. After that, a wiring pattern made of another electrode layer is formed.

The piezoelectric/electrostrictive device can be used as an actuator element in which an electric field is applied to the piezoelectric/electrostrictive layer by supplying an electric signal to the wiring pattern so that the piezoelectric/electrostrictive layer is consequently displaced. The device also can be used as a sensor element. In the sensor element, an electric signal generated depending on the pressure applied to the piezoelectric/electrostrictive layer is outputted from the wiring pattern (see, for example, Japanese Laid-Open Patent Publication No. 2001-210887).

The process of manufacturing such a piezoelectric/electrostrictive device includes a cutting step of cutting a workpiece with a diamond cutter or the like in order to produce a number of pieces and remove unwanted portions.

In the cutting process, since the piezoelectric/electrostrictive layer and the ceramic substrate is of high hardness, they can be severed neatly along cutting lines. However, the electrode layer contains a metal that is lower in hardness than ceramics, and hence it is difficult to sever the electrode layer neatly along cutting lines, tending to leave burrs.

When a voltage is applied to the electrode layer, an electric discharge is liable to occur at the tip end of a burr. The electric discharge causes an excessive current to flow, or its plasma tends to break a portion of the piezoelectric/electrostrictive layer. If the burr is too long, it may cause a short-circuit between electrode layers that face each other.

For solving the above problem, it is necessary to remove the burrs that have been produced. Deburring processes include a process of polishing cut surfaces of the piezoelectric/electrostrictive device and a process of selectively etching a portion of the electrode layer.

However, the polishing process is apt to increase the manufacturing cost. The etching process is problematic in that if the electrode material is a corrosion-resistant metal such as platinum, then it is difficult to etch the electrode material.

SUMMARY OF THE INVENTION

It is an object of the present invention to provide a piezoelectric/electrostrictive element and a piezoelectric/electrostrictive device less liable to produce an electric discharge at the tip ends of electrode layers and capable of preventing a short-circuit from forming between the electrode layers that face each other.

Another object of the present invention is to provide a method of manufacturing a piezoelectric/electrostrictive element and a method of manufacturing a piezoelectric/electrostrictive device, the methods being capable of easily manufacturing a piezoelectric/electrostrictive element and a piezoelectric/electrostrictive device less liable to produce an electric discharge at the tip ends of electrode layers and capable of preventing a short-circuit from forming between the electrode layers that face each other.

A piezoelectric/electrostrictive element according to the present invention has a structure in which a piezoelectric/electrostrictive layer and electrode layers are stacked in an interdigitating comb-shaped pattern. The electrode layers have respective ends projecting outwardly from an end face of the piezoelectric/electrostrictive layer on a side surface where the laminated state of the piezoelectric/electrostrictive layer and the electrode layers is exposed, and the distance by which the ends project outwardly from the end face is equal to or smaller than one half of the thickness of the piezoelectric/electrostrictive layer between the electrode layers.

A piezoelectric/electrostrictive device according to the present invention has at least laminated piezoelectric/electrostrictive elements disposed on a ceramic substrate, the piezoelectric/electrostrictive elements having a structure in which a piezoelectric/electrostrictive layer and electrode layers are stacked in an interdigitating comb-shaped pattern. The electrode layers have respective ends projecting outwardly from an end face of the piezoelectric/electrostrictive layer on a side surface where the laminated state of the piezoelectric/electrostrictive layer and the electrode layers is exposed, and the distance by which the ends project outwardly from the end face is equal to or smaller than one half of the thickness of the piezoelectric/electrostrictive layer between the electrode layers.

Since the ends of the electrode layers project outwardly from the end face of the piezoelectric/electrostrictive layer on the side surface where the laminated state of the piezoelectric/electrostrictive layer and the electrode layers is exposed, even when an object is brought into contact with the side surface of the piezoelectric/electrostrictive elements, only the projecting ends of the electrode layers are plastically deformed, and no particles are scattered from the piezoelectric/electrostrictive layer.

Inasmuch as the ends of the electrode layers project outwardly from the end face of the piezoelectric/electrostrictive layer and the piezoelectric/electrostrictive layer is retracted back from the electrode layers, even when an electric discharge occurs on the side surface of the piezoelectric/electrostrictive elements, the electric discharge does not affect the piezoelectric/electrostrictive layer, which is thus prevented from breaking and scattering by the impact of the electric discharge.

In particular, as the surface of the piezoelectric/electrostrictive layer between the electrode layers is concave, the distance along the piezoelectric surface between the electrode layers is increased to suppress a dielectric breakdown on the side surface of the piezoelectric/electrostrictive elements.

However, if the ends of the electrode layers excessively project outwardly, then when an object is brought into contact with the side surface of the piezoelectric/electrostrictive elements, the electrode layers tend to be deformed, shortening the distance between the electrode layers to allow an electric discharge to occur easily.

If the ends of the electrode layers do not project outwardly from the end face of the piezoelectric/electrostrictive layer or project outwardly too small a distance, then small clearances are created between the piezoelectric/electrostrictive layer and the electrode layers when the assembly is subsequently heat-treated. When dust particles are trapped into the clearances, they cannot easily be removed, and become responsible for a ground leakage. If the assembly is ultrasonically cleaned in order to remove the trapped dust particles, then cavitation occurs in the clearances, making it easy for the piezoelectric/electrostrictive layer and the electrode layers to peel off from each other.

According to the present invention, however, since the distance by which the ends project outwardly from the end face is equal to or smaller than one half of the thickness of the piezoelectric/electrostrictive layer between the electrode layers, even when an object is brought into contact with the side surface of the piezoelectric/electrostrictive elements, the electrode layers are less liable to be deformed, and the distance between the electrode layers is not reduced. No clearances are created between the piezoelectric/electrostrictive layer and the electrode layers, and hardly any dust particles are trapped therebetween. Therefore, the above problems do not arise.

According to the present invention, therefore, because the distance by which the ends project outwardly from the end face is equal to or smaller than one half of the thickness of the piezoelectric/electrostrictive layer between the electrode layers, an electric discharge is less liable to occur at the ends of the electrode layers, and a short circuit is prevented from occurring between the electrode layers.

In the above arrangement, the distance is preferably in a range from 0.5 µm to 2 µm. The electrode layers may include a cermet.

According to the present invention, a method of manufacturing a piezoelectric/electrostrictive element having a structure in which a piezoelectric/electrostrictive layer and electrode layers are stacked in an interdigitating comb-shaped pattern includes the steps of stacking a wide piezoelectric/electrostrictive layer and narrow electrode layers in an interdigitating comb-shaped pattern and sintering the layers into a piezoelectric/electrostrictive element block, cutting the piezoelectric/electrostrictive element block off into a plurality of piezoelectric/electrostrictive elements, and heat-treating the piezoelectric/electrostrictive elements, wherein the piezoelectric/electrostrictive elements are heat-treated at a heat treatment temperature for a period of time where the temperature and the period of time are indicated by an area surrounded by a critical curve beyond which a metal contained in the electrode layers is deformed and a critical curve beyond which the metal contained in the electrode layers is ruptured or a critical curve beyond which the piezoelectric/electrostrictive layer is decomposed.

According to the present invention, a method of manufacturing a piezoelectric/electrostrictive device having at least laminated piezoelectric/electrostrictive elements disposed on a ceramic substrate, the piezoelectric/electrostrictive elements having a structure in which a piezoelectric/electrostrictive layer and electrode layers are stacked in an interdigitating comb-shaped pattern, includes the steps of stacking a wide piezoelectric/electrostrictive layer and wide electrode layers in an interdigitating comb-shaped pattern on a ceramic laminated body and sintering the assembly into a piezoelectric/electrostrictive device block, cutting the piezoelectric/electrostrictive device block off into a plurality of piezoelectric/electrostrictive devices, and heat-treating the piezoelectric/electrostrictive elements of the piezoelectric/electrostrictive devices. The piezoelectric/electrostrictive elements are heat-treated at a heat treatment temperature for a period of time where the temperature and the period of time are indicated by an area surrounded by a critical curve beyond which a metal contained in the electrode layers is deformed and a critical curve beyond which the metal contained in the electrode layers is ruptured or a critical curve beyond which the piezoelectric/electrostrictive layer is decomposed.

The critical curve beyond which the metal contained in the electrode layers is deformed is a critical curve derived from the results of a measuring process for determining whether the metal has changed or not by comparing the electrode layers before the heat treatment and the electrode layers after the heat treatment, with an SEM (scanning electron microscope) at a magnification of 1000 or higher.

The critical curve beyond which the piezoelectric/electrostrictive layer is decomposed is defined as follows. When the piezoelectric/electrostrictive layer is placed in a high-temperature environment in the atmosphere, an easily volatile component in the piezoelectric/electrostrictive layer, e.g., Pb in PZT (lead zirconate titanate) is volatilized, resulting in a shift in the composition of the piezoelectric/electrostrictive layer. If the piezoelectric/electrostrictive layer is stabilized in this state, a phase other than the PZT (hetero-phase) is precipitated depending on the shift in the composition. Therefore, when the piezoelectric/electrostrictive layer is decomposed, a hetero-phase is precipitated. According to the present invention, an upper limit below which no hetero-phase is precipitated is referred to as "critical curve beyond which the piezoelectric/electrostrictive layer is decomposed". If the piezoelectric/electrostrictive layer is decomposed and a hetero-phase is precipitated, then the piezoelectric/electrostrictive layer is lowered in characteristics. Therefore, the piezoelectric/electrostrictive layer should not preferably be decomposed.

The piezoelectric/electrostrictive elements are preferably heat-treated at a temperature for a period of time where the electrode layers which have been heat-treated have respective ends projecting outwardly from an end face of the piezoelectric/electrostrictive layer on a side surface at which the laminated state of the piezoelectric/electrostrictive layer and the electrode layers is exposed, and the distance by which the ends project outwardly from the end face is equal to or smaller than one half of the thickness of the piezoelectric/electrostrictive layer between the electrode layers. Particularly, the piezoelectric/electrostrictive elements are preferably heat-treated at a temperature for a period of time where the distance is in a range from 0.5 µm to 2 µm.

The above method makes it easy to manufacture a piezoelectric/electrostrictive element and a piezoelectric/electrostrictive device less liable to produce an electric discharge at the tip ends of the electrode layers and capable of preventing a short-circuit from forming between the electrode layers that face each other.

After the piezoelectric/electrostrictive element block is cut off into a plurality of piezoelectric/electrostrictive elements, the piezoelectric/electrostrictive elements are heat-treated, or after the piezoelectric/electrostrictive device block is cut off into a plurality of piezoelectric/electrostrictive devices, the piezoelectric/electrostrictive elements of the piezoelectric/electrostrictive devices are heat-treated. Therefore, the surfaces of the electrode layers are smooth and free of burrs, or have reduced burrs.

Since the crystalline state of the piezoelectric/electrostrictive layer is restored by the heat-treatment, microcracks produced before the heat-treatment can be essentially eliminated. Furthermore, machining strains that have remained in the machined surfaces (the cut surfaces of the piezoelectric/electrostrictive layer and the electrode layers) can be reduced. Consequently, the piezoelectric/electrostrictive elements or the piezoelectric/electrostrictive device has increased characteristics and reliability.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

An embodiment of a piezoelectric/electrostrictive element, a method of manufacturing a piezoelectric/electrostrictive element, a piezoelectric/electrostrictive device, and a method of manufacturing a piezoelectric/electrostrictive device according to the present invention will be described below with reference to FIGS. 1 through 15.

The piezoelectric/electrostrictive device 10 of this embodiment includes a piezoelectric/electrostrictive element converting between electric energy and mechanical energy. Therefore, the piezoelectric/electrostrictive device 10 is most preferably used as an active element such as a variety of actuators and vibrators, especially as a displacement element using the inverse piezoelectric effect and the electrostrictive effect. Furthermore, the piezoelectric/electrostrictive device 10 is also preferably used as a passive element such as acceleration sensor elements and shock sensor elements.

Figure 1:
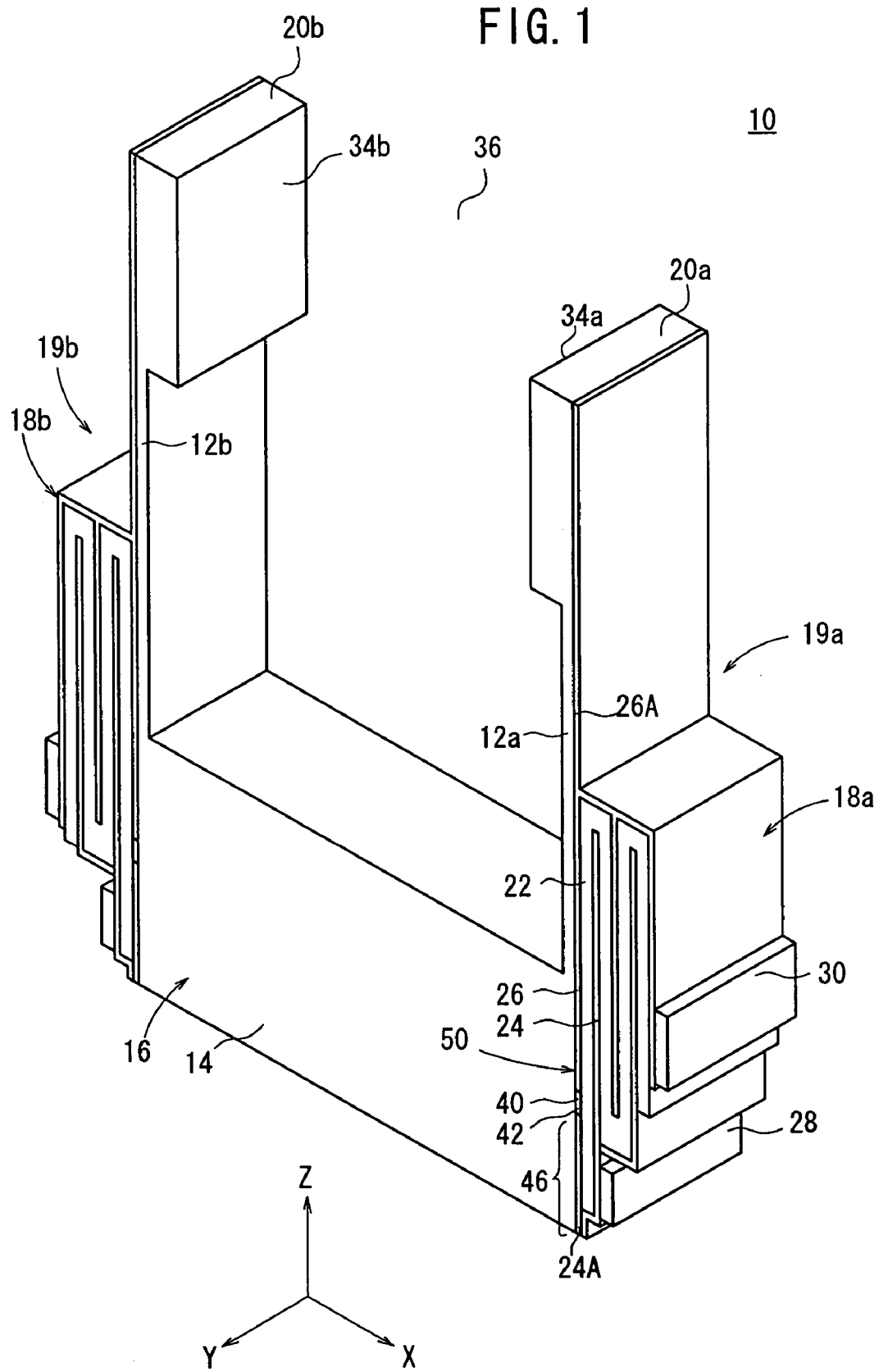
FIG. 1 is a perspective view showing an arrangement of a piezoelectric/electrostrictive device according to an embodiment of the present invention.

As shown in FIG. 1, the piezoelectric/electrostrictive device 10 of this embodiment has a ceramic substrate 16 integrally comprising a pair of mutually opposing thin plate sections 12a, 12b, and a fixed section 14 for supporting the thin plate sections 12a, 12b. Piezoelectric/electrostrictive elements 18a, 18b are formed on the pair of thin plate sections 12a, 12b, respectively. Each surface of the thin plate sections 12a, 12b is partly occupied by the respective piezoelectric/electrostrictive elements 18a, 18b.

In the piezoelectric/electrostrictive device 10, the pair of thin plate sections 12a, 12b are displaced in accordance with the driving of the piezoelectric/electrostrictive elements 18a, 18b, or the displacement of the thin plate sections 12a, 12b is detected by the piezoelectric/electrostrictive elements 18a, 18b. Therefore, in the illustrative device shown in FIG. 1, actuator sections 19a, 19b are constructed by the thin plate sections 12a, 12b and the piezoelectric/electrostrictive elements 18a, 18b. Accordingly, the pair of thin plate sections 12a, 12b function as vibrating sections which can be vibrated while supported by the fixed section 14.

Each of the distal end portions of the pair of thin plate sections 12a, 12b is inwardly thick-walled. The thick-walled portions function as movable sections which are displaceable in accordance with the displacing action of the thin plate sections 12a, 12b. The distal end portions of the pair of thin plate sections 12a, 12b also function as article attachments for sandwiching and attaching an article thereto. The distal end portions of the thin plate sections 12a, 12b will hereinafter referred to as movable sections 20a, 20b.

A gap (air) 36 may be interposed between mutually opposing end surfaces 34a, 34b of the movable sections 20a, 20b. Alternatively, although not shown, a plurality of members which are made from the same material as or the different material from the constitutive material of the movable sections 20a, 20b may be interposed between the end surfaces 34a, 34b. In this arrangement, the mutually opposing end surfaces 34a, 34b of the respective movable sections 20a, 20b function as attachment surfaces 34a, 34b.

Figure 13:
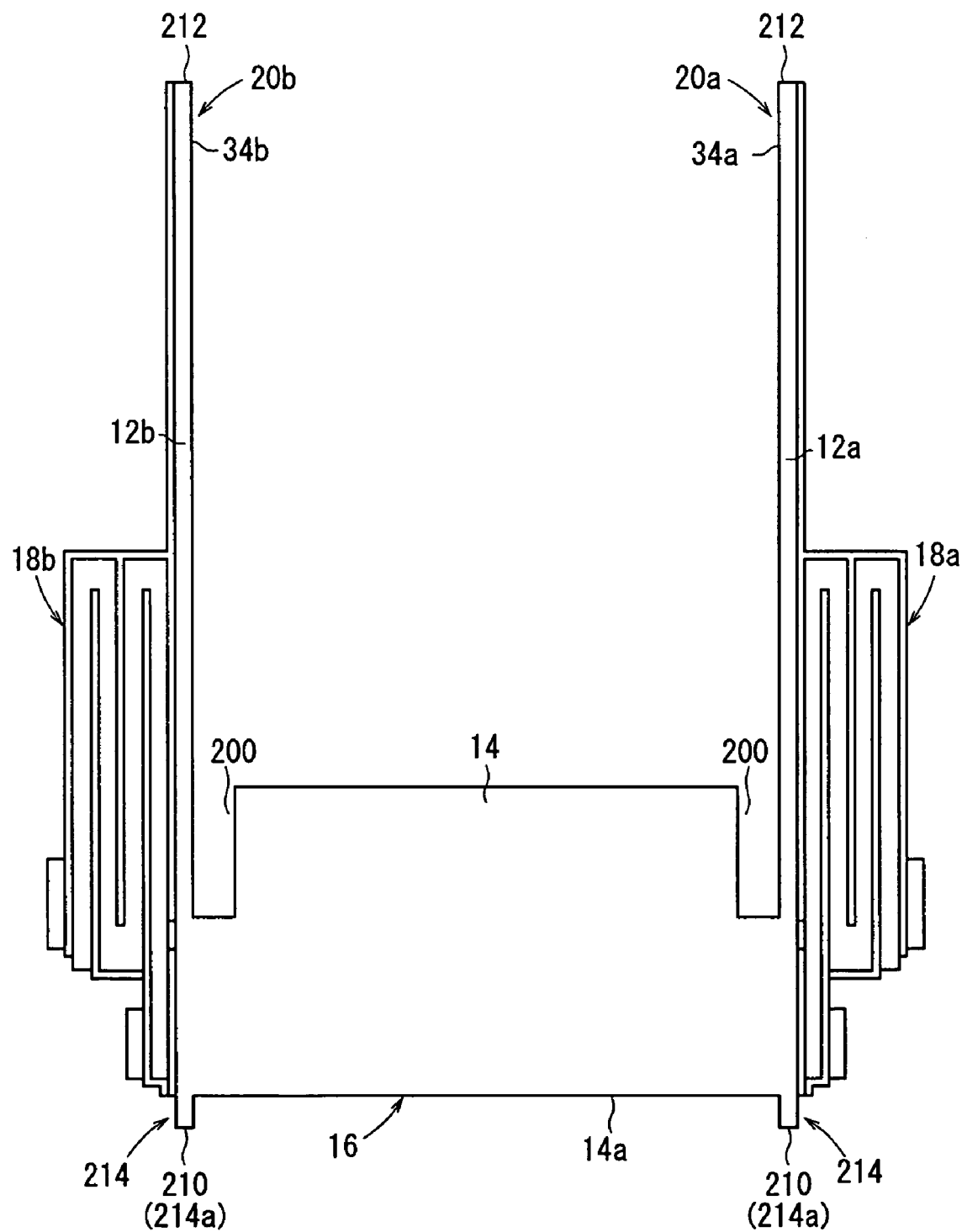
FIG. 13 is a front elevational view of a piezoelectric/electrostrictive device according to a first specific example.

The movable sections 20a, 20b may not have the structure shown in FIG. 1, but may be of a structure as shown in FIG. 13 in which the distal end portions of the thin plate sections 12a, 12b are not thicker, but are substantially as thick as intermediate portions, for example, of the thin plate sections 12a, 12b.

The ceramic substrate 16 is a ceramic laminate. For example, several ceramic green sheets are laminated and sintered into the ceramic laminate. This feature will be described later.

The integrated ceramics as described above scarcely suffers from changes over time, because no adhesive exists on joined portions of the respective parts. Therefore, the joined portions are highly reliable, and the structure is advantageous to ensure the rigidity. Further, such an integrated ceramics can be produced with ease in accordance with the ceramic green sheet-laminating method as described later.

The piezoelectric/electrostrictive elements 18a, 18b are prepared separately from the ceramic substrate 16 as described later, and are directly formed on the ceramic substrate 16 by the film formation method.

Each of the piezoelectric/electrostrictive elements 18a, 18b comprises a piezoelectric/electrostrictive layer 22, and a pair of electrode layers 24, 26 formed on both sides of the piezoelectric/electrostrictive layer 22. The electrode layer 24 of the pair of electrode layers 24, 26 is formed at least on each of the pair of thin plate sections 12a, 12b.

In the embodiment of the present invention, each of the piezoelectric/electrostrictive layer 22 and the pair of electrode layers 24, 26 has a multilayered structure. The electrode layer 24 and the electrode layer 26 are alternately stacked such that a comb-shaped cross section is obtained, and the electrode layer 24 and the electrode layer 26 are stacked with each other with the piezoelectric/electrostrictive layer 22 interposed therebetween. As a result, the piezoelectric/electrostrictive elements 18a, 18b is constructed in multiple stages in the multilayered structure. However, the present invention is not limited to the multilayered structure as described above. A single-layered structure is also applicable in this invention.

Figure 2:
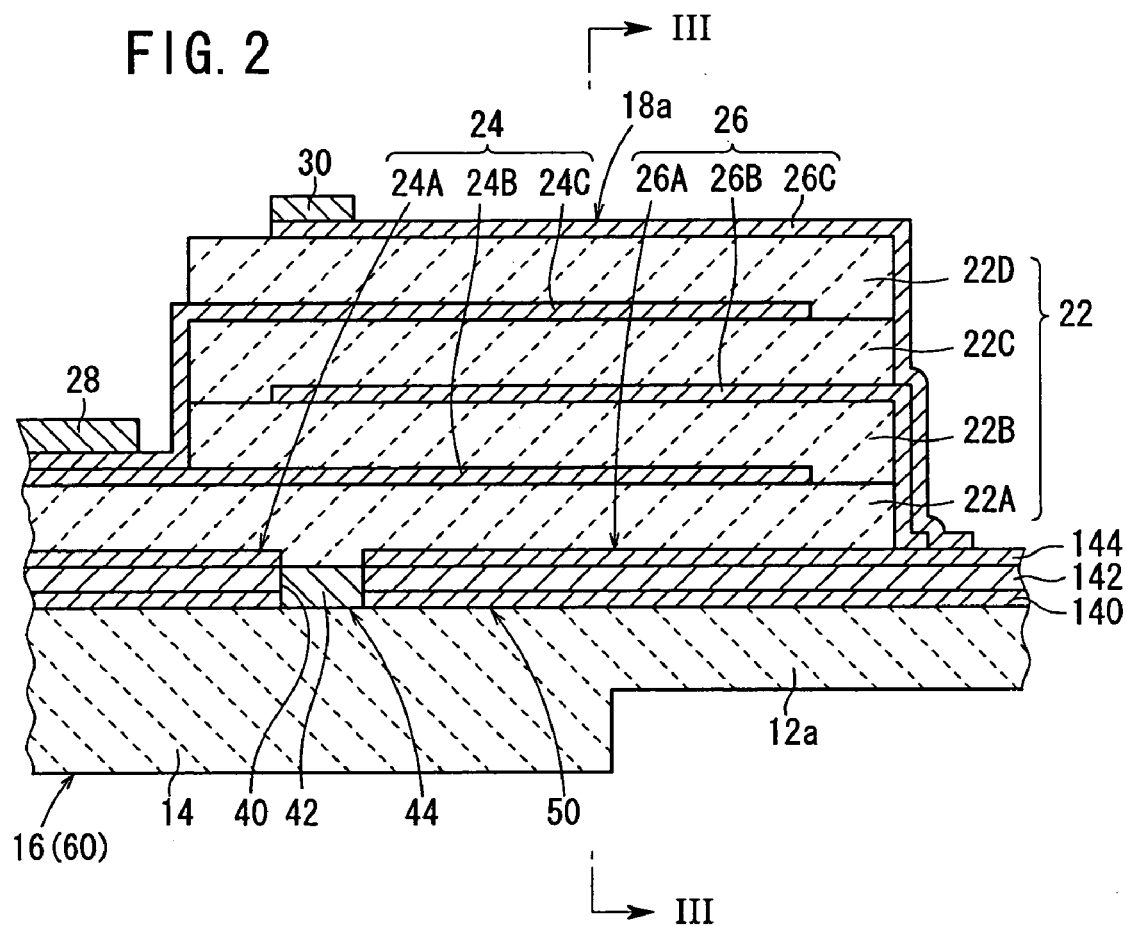
FIG. 2 is an enlarged view showing a piezoelectric/electrostrictive element of the piezoelectric/electrostrictive device according to the embodiment of the present invention.

As shown in an enlarged scale in FIG. 2, each of the piezoelectric/electrostrictive elements 18a, 18b includes the piezoelectric/electrostrictive layer 22 which has a four-layered structure (first to fourth layers of piezoelectric/electrostrictive layer 22A to 22D).

In particular, a first wiring pattern 50 is disposed substantially continuously on the thin plate sections 12a, 12b, the movable sections 20a, 20b, and the side surfaces of the fixed section 14 of the ceramic substrate 16. The first wiring pattern 50 is separated by an air gap 40 on the side surface of the fixed section 14 into a portion 24A (a portion serving as the electrode layer 24) and another portion 26A (a portion serving as the other electrode layer 26).

The air gap 40 is filled with an insulating layer 42 which functions as an insulating region 44 in the first wiring pattern 50.

The electrode layer 24 is constructed in a comb-shaped pattern of the portion 24A of the first wiring pattern 50, a second wiring pattern 24B disposed on an upper surface of the first piezoelectric/electrostrictive layer 22A, and a fourth wiring pattern 24C disposed on an upper surface of the third piezoelectric/electrostrictive layer 22C.

The other electrode layer 26 is constructed in a comb-shaped pattern of the portion 26A of the first wiring pattern 50, a third wiring pattern 26B disposed on an upper surface of the second piezoelectric/electrostrictive layer 22B, and a fifth wiring pattern 26C disposed on an upper surface of the fourth piezoelectric/electrostrictive layer 22D.

A terminal 28 is disposed on an upper surface of the region where the portion 24A of the first wiring pattern 50, the second wiring pattern 24B, and the fourth wiring pattern 24C are laminated, and another terminal 30 is disposed on an end of the fifth wiring-pattern 26C that is positioned in an uppermost layer.

The insulating region 44 is advantageous in that (1) it does not energize an actuator on a rear end portion 46 (a portion from a rear end of the air gap 40 to the rear end of the fixed section 14) of the piezoelectric/electrostrictive elements 18a, 18b, and (2) a short circuit is less liable to occur at the end of the terminal 28.

As shown in FIG. 2, the first wiring pattern 50 of the piezoelectric/electrostrictive device 10 according to the present embodiment is of a three-layer structure.

Specifically, the first wiring pattern 50 has a first layer 140 directly disposed on the ceramic substrate 16 and made of a cermet of the substrate material and the electrode material, a second layer 142 disposed on the first layer 140 and made of the electrode material, and a third layer 144 disposed on the second layer 142 and made of a cermet of the piezoelectric/electrostrictive material and the electrode material.

According to the present embodiment, furthermore, of the other electrode layer 26, the fifth wiring pattern 26C that is positioned in the uppermost layer is made of a resinate of the electrode material. The wiring patterns (the second through fourth wiring patterns 24B, 26B, 24C) of the electrode layers disposed in the piezoelectric/electrostrictive elements 18a, 18b are produced by sintering a cermet film including the electrode material and the piezoelectric/electrostrictive material, and the sintered second through fourth wiring patterns 24B, 26B, 24C have respective conductive portions whose areas take up 80% or more of the areas of the wiring patterns 24B, 26B, 24C.

In this arrangement, the volume ratio between the electrode material and the piezoelectric/electrostrictive material is preferably 4:6 through 9:1, because it is necessary that the second to fourth wiring patterns 24B, 26B, 24C function as conductor layers.

Figure 3:
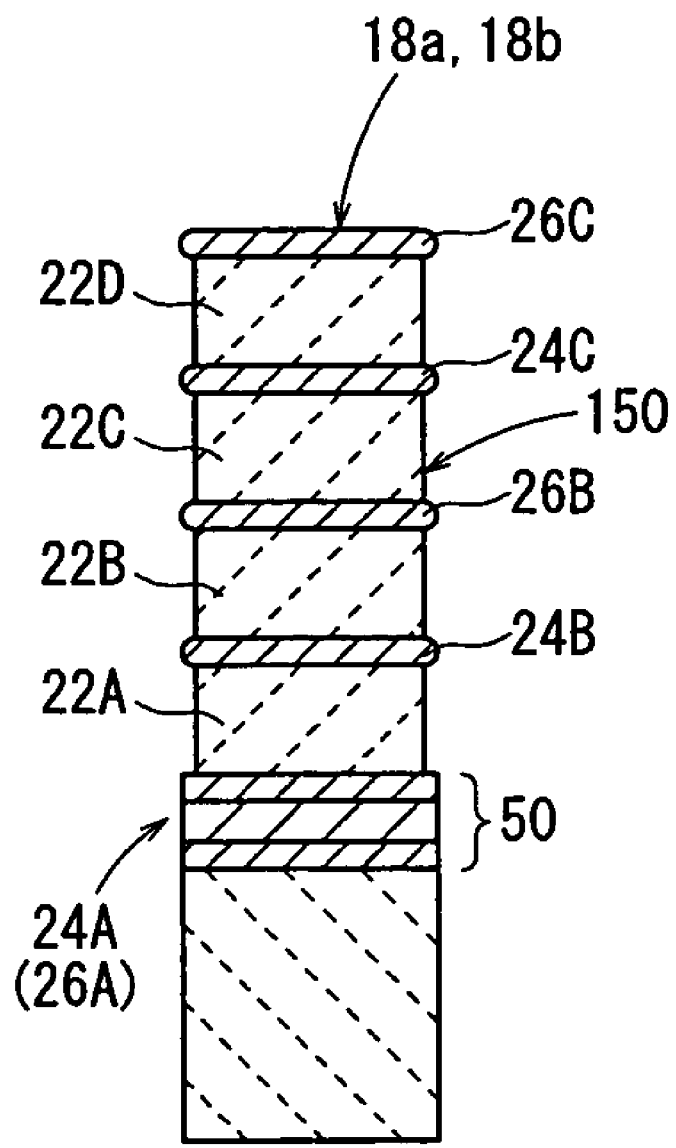
FIG. 3 is a cross-sectional view taken along line III-III of FIG. 2.
Figure 4:
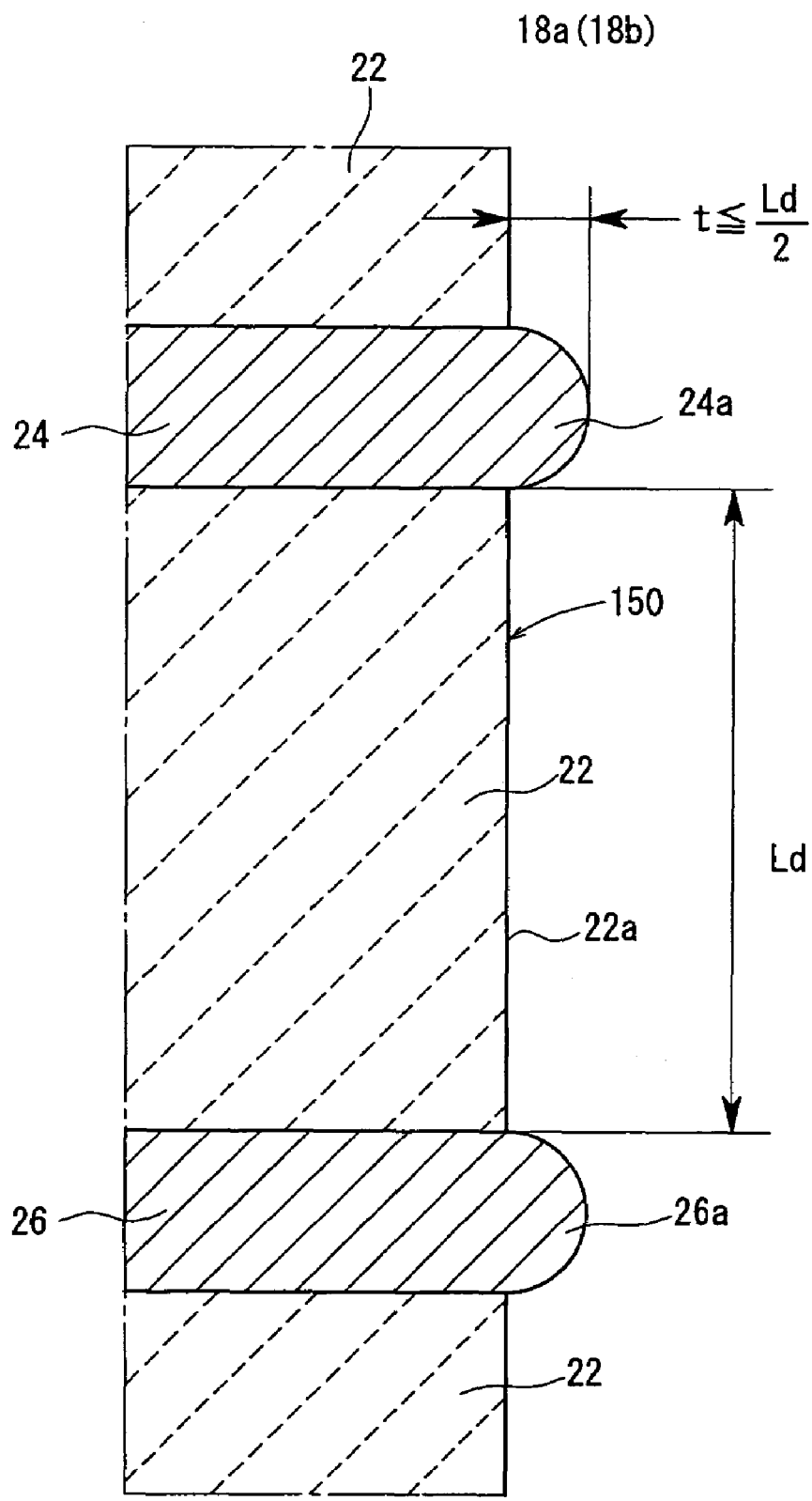
FIG. 4 is an enlarged view of a portion of FIG. 3.
Figure 5:
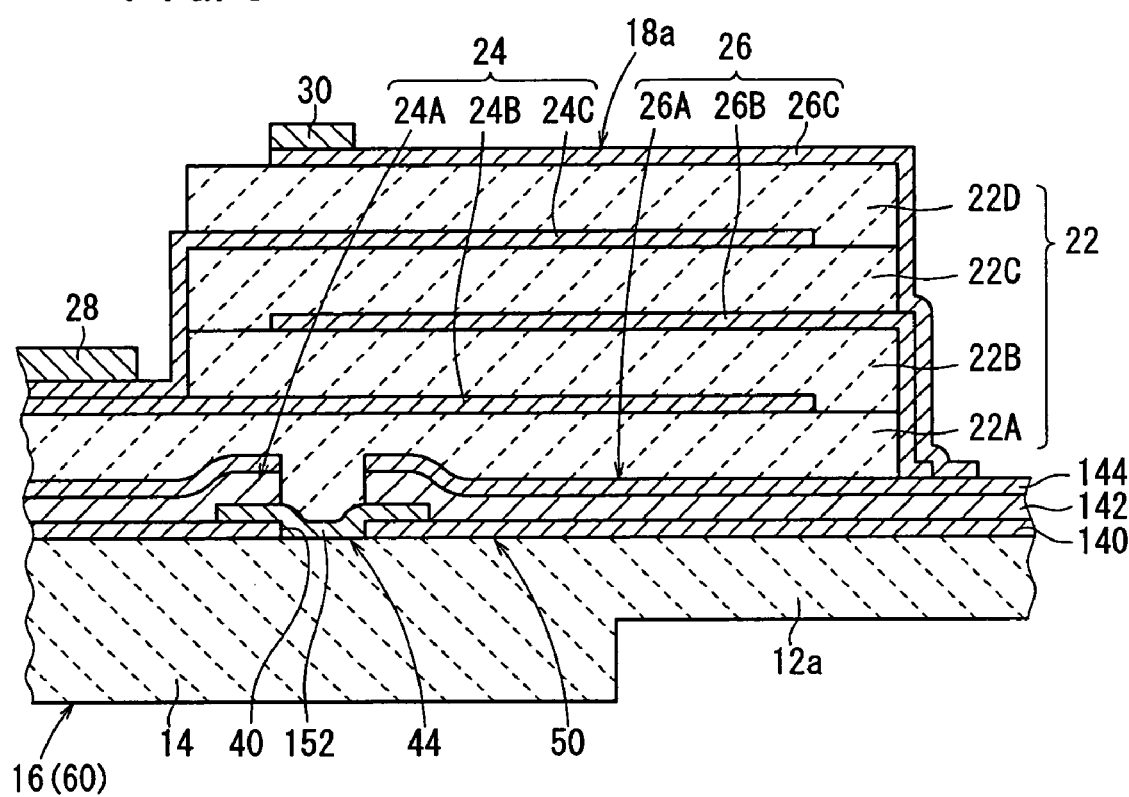
FIG. 5 is an enlarged view showing a piezoelectric/electrostrictive element of a piezoelectric/electrostrictive device according to a first modification.

As shown in FIGS. 3 and 4, in the piezoelectric/electrostrictive elements 18a, 18b of the piezoelectric/electrostrictive device 10 according to the present embodiment, the electrode layers 24, 26 have respective ends 24a, 26a projecting outwardly from an end face 22a of the piezoelectric/electrostrictive layer 22 on a side surface 150 where the laminated state of the piezoelectric/electrostrictive layer 22 and the electrode layers 24, 26 is exposed. The distance t by which the ends 24a, 26a project outwardly from the end face 22a is equal to or smaller than one half of the thickness Ld of the piezoelectric/electrostrictive layer 22 between the electrode layers 24, 26. The projecting distance t should preferably be in a range from 0.5 µm to 2 µm.

Therefore, the present embodiment offers the following advantages. Since the ends 24a, 26a of the electrode layers 24, 26 project outwardly from the end face 22a of the piezoelectric/electrostrictive layer 22 on the side surface 150 where the laminated state of the piezoelectric/electrostrictive layer 22 and the electrode layers 24, 26 is exposed, even when an object is brought into contact with the side surface of the piezoelectric/electrostrictive elements 18a, 18b, only the projecting ends 24a, 26a of the electrode layers 24, 26 are plastically deformed, and no particles are scattered from the piezoelectric/electrostrictive layer 22 (no particles are scattered by impact).

Inasmuch as the ends 24a, 26a of the electrode layers 24, 26 project outwardly from the end face 22a of the piezoelectric/electrostrictive layer 22 and the piezoelectric/electrostrictive layer 22 is retracted back from the electrode layers 24, 26, even when an electric discharge occurs on the side surface of the piezoelectric/electrostrictive elements 18a, 18b, the electric discharge does not affect the piezoelectric/electrostrictive layer 22, which is thus prevented from breaking and scattering by the impact of the electric discharge.

In particular, as the surface of the piezoelectric/electrostrictive layer 22 between the electrode layers 24, 26 is concave, the distance along the piezoelectric surface between the electrode layers 24, 26 is increased to suppress a dielectric breakdown on the side surface of the piezoelectric/electrostrictive elements 18a, 18b.

However, if the ends 24a, 26a of the electrode layers 24, 26 excessively project outwardly, then when an object is brought into contact with the side surface of the piezoelectric/electrostrictive elements 18a, 18b, the electrode layers 24, 26 tend to be deformed, shortening the distance between the electrode layers 24, 26 to allow an electric discharge to occur easily.

If the ends 24a, 26a of the electrode layers 24, 26 do not project outwardly from the end face 22a of the piezoelectric/electrostrictive layer 22 or project outwardly too small a distance t, then small clearances are created between the piezoelectric/electrostrictive layer 22 and the electrode layers 24, 26 when the assembly is subsequently heat-treated. When dust particles are trapped into the clearances, they cannot easily be removed, and become responsible for a ground leakage. If the assembly is ultrasonically cleaned in order to remove the trapped dust particles, then cavitation occurs in the clearances, making it easy for the piezoelectric/electrostrictive layer 22 and the electrode layers 24, 26 to peel off from each other.

According to the present embodiment, however, since the distance t by which the ends 24a, 26a project outwardly from the end face 22a is equal to or smaller than one half of the thickness Ld of the piezoelectric/electrostrictive layer 22 between the electrode layers 24, 26, even when an object is brought into contact with the side surface of the piezoelectric/electrostrictive elements 18a, 18b, the electrode layers 24, 26 are less liable to be deformed, and the distance between the electrode layers 24, 26 is not reduced. No clearances are created between the piezoelectric/electrostrictive layer 22 and the electrode layers 24, 26, and hardly any dust particles are trapped therebetween. Therefore, the above problems do not arise.

According to the present embodiment, therefore, because the distance t by which the ends 24a, 26a project outwardly from the end face 22a is equal to or smaller than one half of the thickness Ld of the piezoelectric/electrostrictive layer 22 between the electrode layers 24, 26, an electric discharge is less liable to occur at the ends 24a, 26a of the electrode layers 24, 26, and a short circuit is prevented from occurring between the electrode layers 24, 26.

According to the embodiment described above, the air gap 40 between the portions 24A, 26A of the first wiring pattern 50 is filled with the insulating layer 42 which is thicker than the first layer 140. However, in a piezoelectric/electrostrictive device 10a according to a first modification shown in FIG. 5, the air gap 40 is filled with an insulating layer 152 which is as thick as the first layer 140 and which has a width greater than the air gap 40.

Figure 6:
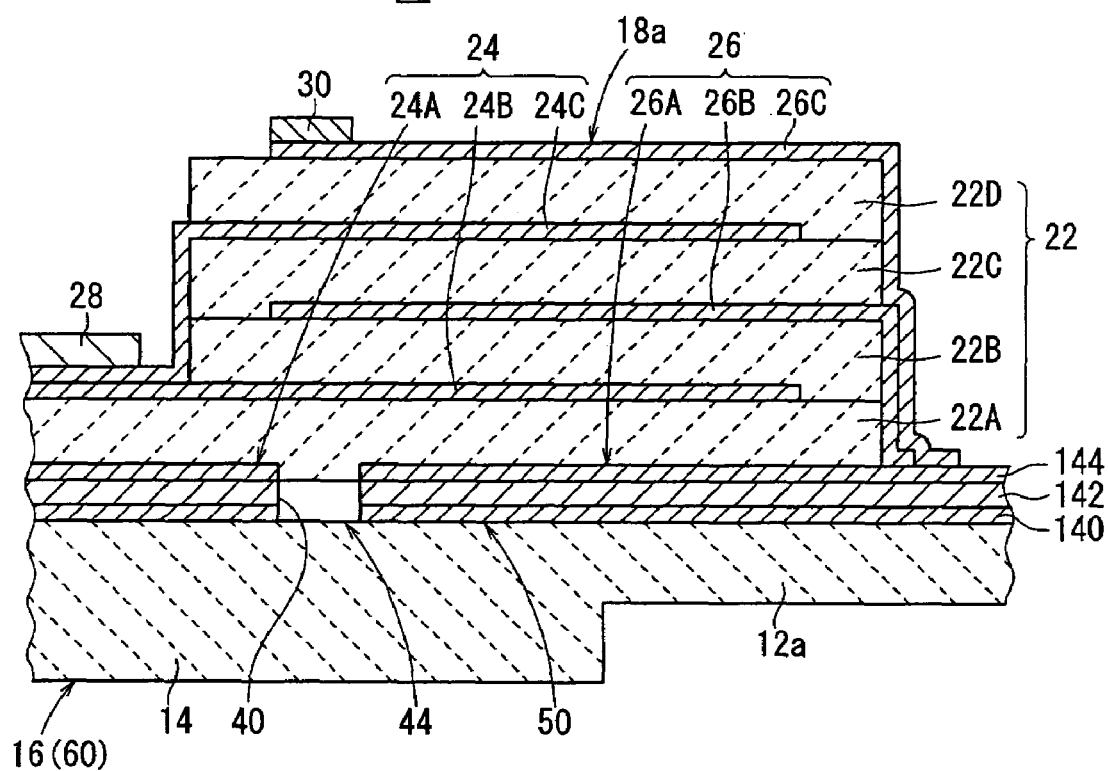
FIG. 6 is an enlarged view showing a piezoelectric/electrostrictive element of a piezoelectric/electrostrictive device according to a second modification.

Alternatively, in a piezoelectric/electrostrictive device 10b according to a second modification shown in FIG. 6, the air gap 40 is filled with nothing but air.

Next, the respective constituents of the piezoelectric/electrostrictive device 10 of this embodiment will be explained.

As described above, the movable sections 20a, 20b are operated based on the driving amounts of the thin plate sections 12a, 12b. A variety of members are attached to the movable sections 20a, 20b depending on the use of the piezoelectric/electrostrictive device 10. For example, when the piezoelectric/electrostrictive device 10 is used as a displacement element, a shield plate or the like for an optical shutter is attached. Especially, when the piezoelectric/electrostrictive device 10 is used for the positioning of a magnetic head of a hard disk drive or for a ringing-suppressing mechanism, a member required to be positioned including a magnetic head, a slider provided with a magnetic head, and a suspension provided with a slider is attached.

As described above, the fixed section 14 supports the thin plate sections 12a, 12b and the movable sections 20a, 20b. For example, when the piezoelectric/electrostrictive device 10 is utilized to position a magnetic head of a hard disk drive as described above, the fixed section 14 is supported and secured, for example, to a carriage arm attached to VCM (voice coil motor) or a suspension or a fixed plate attached to the carriage arm. Accordingly, the entire piezoelectric/electrostrictive device 10 is fixed. Further, as shown in FIG. 1, the terminals 28, 30 and other members for driving the piezoelectric/electrostrictive elements 18a, 18b may be arranged on the fixed section 14.

The materials of the movable sections 20a, 20b and the fixed section 14 are not specifically limited as long as the materials have certain rigidity. However, the ceramics, to which the ceramic green sheet-laminating method is applicable, can be preferably used as described above.

Specifically, proposed materials include a major component such as zirconia represented by fully stabilized zirconia or partially stabilized zirconia, alumina, magnesia, silicon nitride, aluminum nitride, or titanium oxide. Further, materials containing a mixture of the foregoing compounds as a major component are also proposed. However, it is especially preferable to use a material containing fully stabilized zirconia as a major component or a material containing partially stabilized zirconia as a major component, in view of the high mechanical strength and the high toughness.

As described above, the thin plate sections 12a, 12b are driven in accordance with the displacement of the piezoelectric/electrostrictive elements 18a, 18b. Each of the thin plate sections 12a, 12b is a thin plate-shaped member having flexibility. The thin plate sections 12a, 12b amplify the expansion and shrink displacement of the piezoelectric/electrostrictive elements 18a, 18b arranged on the surface thereof and transmit the bending displacement to the movable sections 20a, 20b. Therefore, the shape and the material quality of the thin plate sections 12a, 12b are selected considering flexibility and mechanical strength thereof so as not to be broken due to bending. The shape and the material quality of the thin plate sections 12a, 12b may also be appropriately selected in consideration of the response performance and the operability of the movable sections 20a, 20b.

Similar ceramic materials can be preferably used for the material of the thin plate sections 12a, 12b, to the ceramic materials of the movable sections 20a, 20b and the fixed section 14. A material containing fully stabilized zirconia as a major component or a material containing partially stabilized zirconia as a major component is used most preferably, because mechanical strength is large even when a thin-walled member is formed therefrom, toughness is high, and the reactivity with the piezoelectric/electrostrictive layer and the electrode material is small.

The fully stabilized zirconia and the partially stabilized zirconia are preferably fully stabilized or partially stabilized as follows. Chemical compounds which fully stabilize and/ or partially stabilize zirconia include yttrium oxide, ytterbium oxide, cerium oxide, calcium oxide, and magnesium oxide. Zirconia can be stabilized by at least one of the foregoing compounds, or by the foregoing compounds in combination as well.

It is desirable that the compounds are added in the following amounts, i.e., 1 to 30 mole %, preferably 1.5 to 10 mole % in the case of yttrium oxide or ytterbium oxide, 6 to 50 mole %, preferably 8 to 20 mole % in the case of cerium oxide, and 5 to 40 mole %, preferably 5 to 20 mole % in the case of calcium oxide or magnesium oxide. Among them, it is especially preferable to use yttrium oxide as a stabilizer. In this case, it is desirable that yttrium oxide is preferably added in an amount of 1.5 to 10 mole %, and more preferably 2 to 4 mole %. It is possible to add, for example, alumina, silica, and/or oxide of transition metal as an additive of a sintering aid or the like within a range of 0.05 to 20% by weight. However, when the piezoelectric/electrostrictive elements 18a, 18b is formed by sintering into one unit through the film formation method, it is also preferable to add, for example, alumina, magnesia, and/or oxide of transition metal as an additive.

In order to obtain high mechanical strength and stable crystal phase, it is desirable that the average crystal grain size of zirconia is 0.05 to 3 μm, preferably 0.05 to 1 μm. As described above, ceramic materials which are similar to those of the movable sections 20a, 20b and the fixed section 14 can be used for the thin plate sections 12a, 12b. It is preferable that the thin plate sections 12a, 12b are made by using substantially the same material. This is advantageous in that the reliability of the joined portions is improved, the strength of the piezoelectric/electrostrictive device 10 is enhanced, and the complexity of production is reduced.

Each of the piezoelectric/electrostrictive elements 18a, 18b has at least the piezoelectric/electrostrictive layer 22 and the pair of electrode layers 24, 26 for applying the electric field to the piezoelectric/electrostrictive layer 22. The piezoelectric/electrostrictive elements 18a, 18b, can be used as a unimorph type or a bimorph type. However, the piezoelectric/electrostrictive element of the unimorph type, which is used with the thin plate sections 12a, 12b, is more excellent in stability of the generated displacement amount, and it is more advantageous to reduce weight of the device. Therefore, the piezoelectric/electrostrictive element of the unimorph type is more suitable for the piezoelectric/electrostrictive device 10.

It is preferable that the piezoelectric/electrostrictive elements 18a, 18b are formed on the side surfaces of the thin plate sections 12a, 12b as shown in FIG. 1, since the thin plate sections 12a, 12b can be driven more greatly.

Piezoelectric ceramic materials are preferably used for the piezoelectric/electrostrictive layer 22. However, it is also possible to use electrostrictive ceramic materials, ferroelectric ceramic materials, and anti-ferroelectric ceramic materials. When the piezoelectric/electrostrictive device 10 is used to position the magnetic head of the hard disk drive, for example, it is preferable to use a piezoelectric material having small strain hysteresis and/or a material having a coercive electric field of not more than 10 kV/mm, because the linearity between the displacement amount of the movable sections 20a, 20b and the driving voltage or the output voltage is important.

Specifically, piezoelectric materials may include lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and strontium bismuthtantalate. One of these materials can be used or any appropriate mixture of these can be used.

Especially, a material containing lead zirconate, lead titanate, or lead magnesium niobate as a major component, or a material containing sodium bismuth titanate as a major component is preferably used, since such materials have a high electromechanical coupling factor and a high piezoelectric constant. Further, the reactivity with the thin plate sections (ceramics) 12a, 12b of such materials is small when the piezoelectric/electrostrictive layer 22 is sintered so that a device of a stable composition can be obtained.

To these piezoelectric materials, there may be added anyone of or a mixture of, for example, lanthanum, calcium, strontium, molybdenum, tungsten, barium, niobium, zinc, nickel, manganese, cerium, cadmium, chromium, cobalt, antimony, iron, yttrium, tantalum, lithium, bismuth, and stannum.

For example, when lanthanum and/or strontium is contained in major components such as lead zirconate, lead titanate, and lead magnesium niobate, coercive electric field and piezoelectric characteristics are adjustable.

It is undesirable to add a material such as silica which tends to form glass. If the material such as silica is added, the material is readily reacted with the piezoelectric/electrostrictive material during the heat treatment of the piezoelectric/electrostrictive layer 22. As a result, composition is varied, and piezoelectric characteristics are deteriorated.

The pair of electrode layers 24, 26 of the piezoelectric/electrostrictive elements 18a, 18b are made of a metal which is solid at room temperature and which is excellent in conductivity. Materials usable for the pair of electrode layers 24, 26 include metals such as aluminum, titanium, chromium, iron, cobalt, nickel, copper, zinc, niobium, molybdenum, ruthenium, palladium, rhodium, silver, stannum, tantalum, tungsten, iridium, platinum, gold, and lead, and alloys thereof. Further, it is also preferable to use a cermet material obtained by dispersing the same material of the piezoelectric/electrostrictive layer 22 or the thin plate sections 12a, 12b in one of the metals or the alloy described above.

The material of the electrode layers 24, 26 of the piezoelectric/electrostrictive elements 18a, 18b is selected depending on the method of forming the piezoelectric/electrostrictive layer 22. For example, when the piezoelectric/electrostrictive layer 22 is formed by the sintering on the electrode layer 24 after forming the electrode layer 24 on the thin plate sections 12a, 12b, for the electrode layer 24 it is necessary to use a high melting point metal which does not change at the sintering temperature of the piezoelectric/electrostrictive layer 22. The high melting point metal includes platinum, palladium, platinum-palladium alloy, and silver-palladium alloy. However, the outermost electrode, which is formed on the piezoelectric/electrostrictive layer 22 after forming the piezoelectric/electrostrictive layer 22, can be formed at a relatively low temperature. Therefore, for the outermost electrode, it is possible to use a low melting point metal as a major component such as aluminum, gold, and silver.

Each thickness of the electrode layers 24, 26 may be a factor for decreasing the displacement of the piezoelectric/electrostrictive elements 18a, 18b considerably. Therefore, especially for the electrode to be formed after the sintering of the piezoelectric/electrostrictive layer 22, it is preferable to use an organic metal paste with which a dense and thinner film can be obtained by sintering includes gold resinate paste, platinum resinate paste, and silver resinate paste.

The piezoelectric/electrostrictive device 10 in this embodiment can be suitably used for a variety of sensors including ultrasonic wave sensors, acceleration sensors, angular velocity sensors, shock sensors, and mass sensors. The piezoelectric/electrostrictive device 10 in this embodiment is further advantageous since the sensitivity of the sensor can easily be adjusted by changing the size of an object to be attached between the end surfaces 34a, 34b or the thin plate sections 12a, 12b.

As for the method of producing the piezoelectric/electrostrictive device 10, usable methods include the screen printing method described above as well as a thick film formation method such as dipping, application, and electrophoresis and a thin film formation method such as ion beam method, sputtering, vacuum deposition, ion plating method, chemical vapor deposition (CVD), and plating, for forming the piezoelectric/electrostrictive elements 18a, 18b on the surface of the ceramic laminate 60.

When the piezoelectric/electrostrictive elements 18a, 18b are formed by using one of the film formation methods as described above, the piezoelectric/electrostrictive elements 18a, 18b and the thin plate sections 12a, 12b can be joined and arranged integrally without using any adhesive. It is possible to ensure the reliability and the reproducibility of the device, and it is possible to facilitate integration thereof.

In this embodiment, it is preferable that the piezoelectric/electrostrictive elements 18a, 18b are formed by the thick film formation method, for the following reason. When the thick film formation method is used especially for the formation of the piezoelectric/electrostrictive layer 22, the film can be formed by using a paste, a slurry, a suspension, an emulsion, or a sol containing as a major component grains or powder of piezoelectric ceramics having an average grain size of 0.01 to 5 μm, preferably 0.05 to 3 μm. When the film obtained as described above is sintered, it is possible to obtain good piezoelectric/electrostrictive characteristics.

The electrophoresis method is advantageous since the film can be formed at a high density with a high shape accuracy. The screen printing method advantageously simplifies production steps, because the film formation and the pattern formation can be performed simultaneously.

The method of cutting the ceramic laminate 60 includes mechanical machining such as dicing machining and wire saw machining as well as electron beam machining and laser machining using YAG laser, excimer laser, or the like.

Next, explanation will be made with reference to FIGS. 7 to 9 for a method of producing the piezoelectric/electrostrictive device 10 of this embodiment. At first, the following definitions are made. A ceramic green laminate 58 is defined as a laminate which is obtained by laminating ceramic green sheets (see, for example, FIG. 8). A ceramic laminate 60 is defined as a product which is obtained by sintering the ceramic green laminate 58 into one unit (see, for example, FIG. 9). A ceramic substrate 16 is defined as a product which is obtained by cutting unnecessary portions off from the ceramic laminate 60 to integrally have the movable sections 20a, 20b, the thin plate sections 12a, 12b, and the fixed section 14 (see FIG. 1).

In this production method, the ceramic laminate 60 is cut into chip units so that a large number of piezoelectric/electrostrictive devices 10 are produced. In this method, it is supposed that a plurality of piezoelectric/electrostrictive devices 10 are arranged in a vertical direction and in a lateral direction respectively in one substrate. However, in order to simplify the explanation, the following description will be made assuming that one piezoelectric/electrostrictive device 10 is produced.

At first, a binder, a solvent, a dispersing agent, a plasticizer, and other components are added and mixed with a ceramic powder such as zirconia to prepare a slurry. The slurry is subjected to a defoaming treatment to prepare a ceramic green sheet having a predetermined thickness by a method such as the reverse roll coater method or the doctor blade method.

Figure 7:
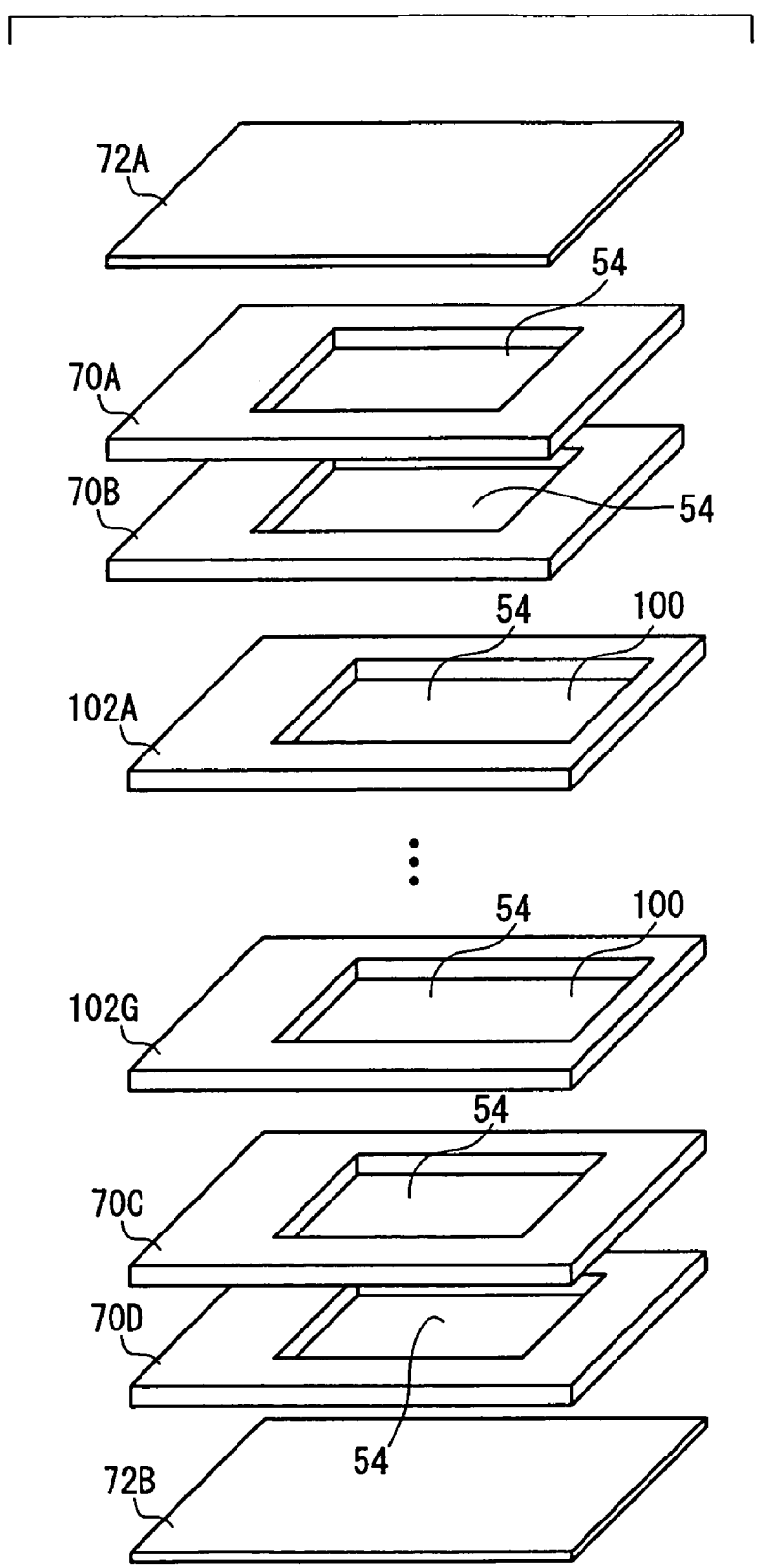
FIG. 7 is a view illustrative of a process of laminating ceramic green sheets that are required.

Subsequently, the ceramic green sheet is processed to have a variety of shapes as shown in FIG. 7 by a method such as laser machining or punching out by using a mold to obtain a plurality of ceramic green sheets 70A to 70D, 72A, 72B, 102A to 102G for forming a plurality of substrates.

The ceramic green sheets 70A to 70D are a plurality of (for example, two) ceramic green sheets which are provided with windows 100 for forming the movable sections 20a, 20b having the end surfaces 34a, 34b of the piezoelectric/electrostrictive device 10. The ceramic green sheets 102A to 102G are a plurality of (for example, four) sheets which are formed with windows 54 for forming a space at least between the thin plate sections 12a, 12b. The numbers of the ceramic green sheets are referred to by way of example.

Figure 8:
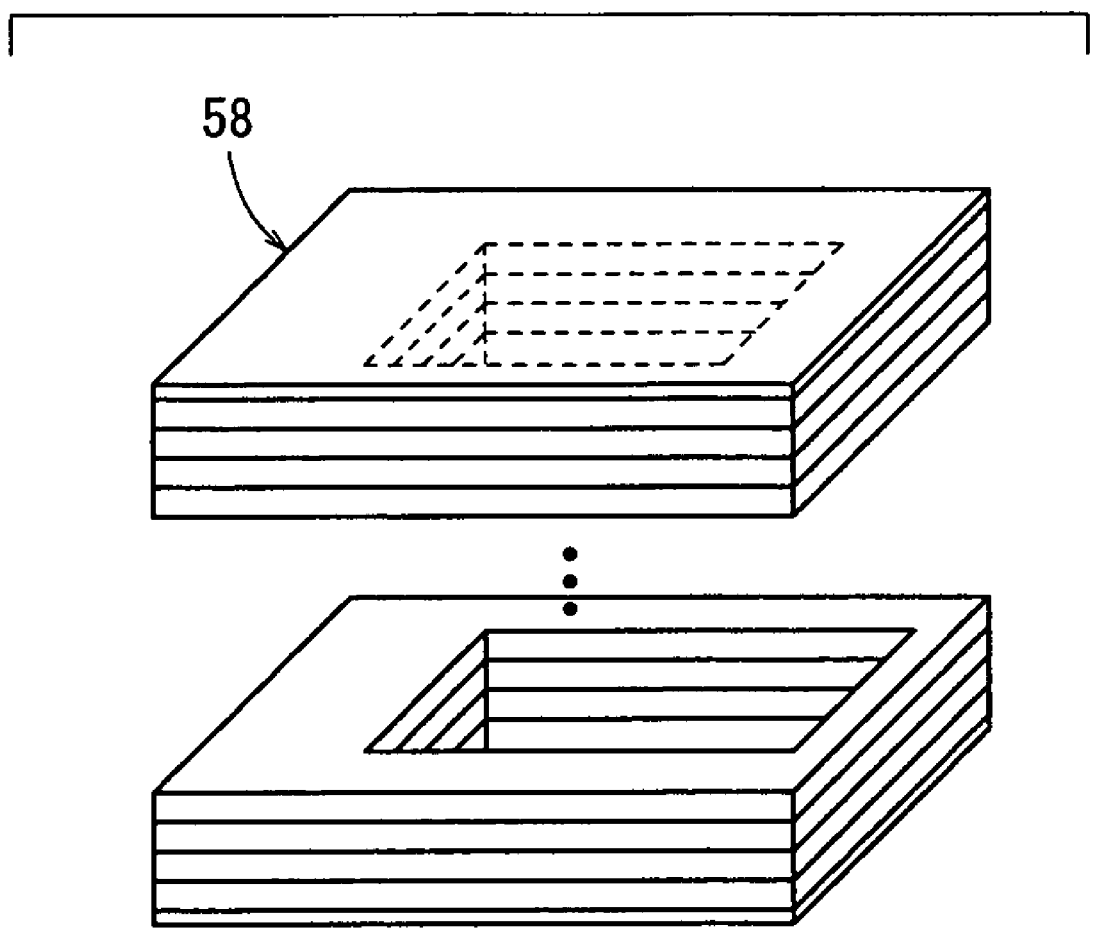
FIG. 8 is a view illustrative of the manner in which the ceramic green sheets are laminated into a ceramic green laminated body.

The ceramic green sheets 70A to 70D, 72A, 72B, 102A to 102G are further laminated so that the ceramic green sheets 70A to 70D, 102A to 102G are interposed between the ceramic green sheets 72A, 72B, followed by fixing to each other under pressure to prepare a ceramic green laminate 58 (see FIG. 8). The ceramic green sheets 70A to 70D, 72A, 72B, 102A to 102G are laminated while the ceramic green sheets 102A to 102G are arranged at the center of the laminated sheet.

During this process, no pressure may be applied to certain portions during fixing under pressure due to the window 100. Therefore, it is necessary that the order of the lamination or the fixing under pressure may be changed for avoiding such portions. After that, the ceramic green laminate 58 is sintered to obtain a ceramic laminate 60 (see FIG. 9).

Figure 9:
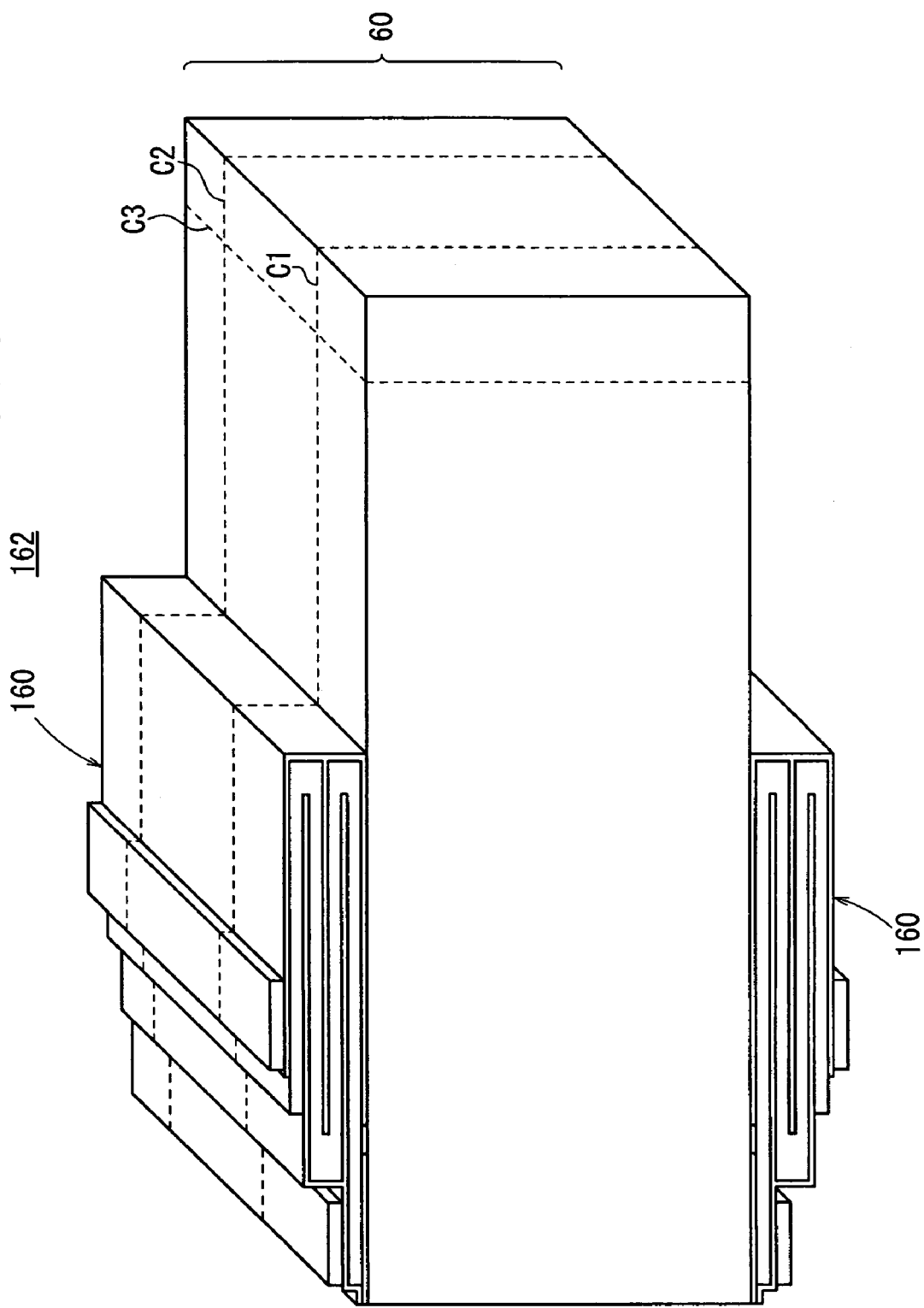
FIG. 9 is a view showing a state wherein the ceramic green laminated body is sintered into a ceramic laminated body, after which piezoelectric/electrostrictive element blocks are formed on the ceramic laminated body (a state in which a piezoelectric/electrostrictive device block is formed)

Then, as shown in FIG. 9, wide piezoelectric/electrostrictive layers and wide piezoelectric/electrostrictive layers are stacked in an interdigitating comb-shaped pattern on both surfaces of the ceramic laminate 60, i.e., the surfaces corresponding to the surfaces on which the ceramic green sheets 72A, 72B are laminated. Then, the assembly is sintered, thereby fabricating piezoelectric/electrostrictive element blocks 160 on the ceramic laminate 60. At this time, a piezoelectric/electrostrictive device block 162 having the ceramic laminate 60 and the piezoelectric/electrostrictive element blocks 160 is fabricated.

In the example shown in FIG. 9, the piezoelectric/electrostrictive element blocks 160 are formed respectively on the upper and lower surfaces of the ceramic laminate 60. However, a piezoelectric/electrostrictive element block 160 may be formed on one surface of the ceramic laminate 60.

Then, as shown in FIG. 9, the piezoelectric/electrostrictive device block 162 with the piezoelectric/electrostrictive element blocks 160 formed therein is severed along cutting lines C1, C2, C3, thereby cutting off side portions and a distal end portion of the piezoelectric/electrostrictive device block 162. When the piezoelectric/electrostrictive device block 162 is thus severed, the piezoelectric/electrostrictive device 10 having the piezoelectric/electrostrictive elements 18a, 18b on the ceramic substrate 16 and the movable sections 20a, 20b having the end surfaces 34a, 34b that confront each other is obtained.

The piezoelectric/electrostrictive device block 162 may be severed first along the cutting lines C1, C2 and then along the cutting line C3, or first along the cutting line C3 and then along the cutting lines C1, C2. Alternatively, the piezoelectric/electrostrictive device block 162 may be severed simultaneously along the cutting lines C1, C2, C3. The end face of the fixed section 14 which faces the cutting line C3 may also be cut off.

Thereafter, the piezoelectric/electrostrictive elements 18a, 18b of the piezoelectric/electrostrictive device 10 are heat-treated. The piezoelectric/electrostrictive elements 18a, 18b are heat-treated at a heat treatment temperature for a period of time where the temperature and the period of time are indicated by an area surrounded by a critical curve beyond which the metal contained in the electrode layers 24, 26 is deformed and a critical curve beyond which the metal contained in the electrode layers 24, 26 is ruptured or a critical curve beyond which the piezoelectric/electrostrictive layer 22 is decomposed.

The critical curve beyond which the metal contained in the electrode layers 24, 26 is deformed is a critical curve derived from the results of a measuring process for determining whether the metal has changed or not by comparing the electrode layers 24, 26 before the heat treatment and the electrode layers 24, 26 after the heat treatment, with an SEM (scanning electron microscope) at a magnification of 1000 or higher. The critical curve beyond which the metal is deformed will hereinafter be referred to as "lower limit for the metal deformation".

The critical curve beyond which the piezoelectric/electrostrictive layer 22 is decomposed is defined as follows. When the piezoelectric/electrostrictive layer 22 is placed in a high-temperature environment in the atmosphere, an easily volatile component in the piezoelectric/electrostrictive layer 22, e.g., Pb in PZT (lead zirconate titanate) is volatilized, resulting in a shift in the composition of the piezoelectric/electrostrictive layer 22. If the piezoelectric/electrostrictive layer 22 is stabilized in this state, a phase other than the PZT (hetero-phase) is precipitated depending on the shift in the composition. Therefore, when the piezoelectric/electrostrictive layer 22 is decomposed, a hetero-phase is precipitated. According to the present embodiment, an upper limit below which no hetero-phase is precipitated is referred to as "critical curve beyond which the piezoelectric/electrostrictive layer is decomposed". If the piezoelectric/electrostrictive layer 22 is decomposed and a hetero-phase is precipitated, then the piezoelectric/electrostrictive layer 22 is lowered in characteristics. Therefore, the piezoelectric/electrostrictive layer 22 should not preferably be decomposed. The critical curve beyond which the piezoelectric/electrostrictive layer is decomposed will hereinafter be referred to as "upper limit for the decomposition of the piezoelectric/electrostrictive layer".

Figure 10:
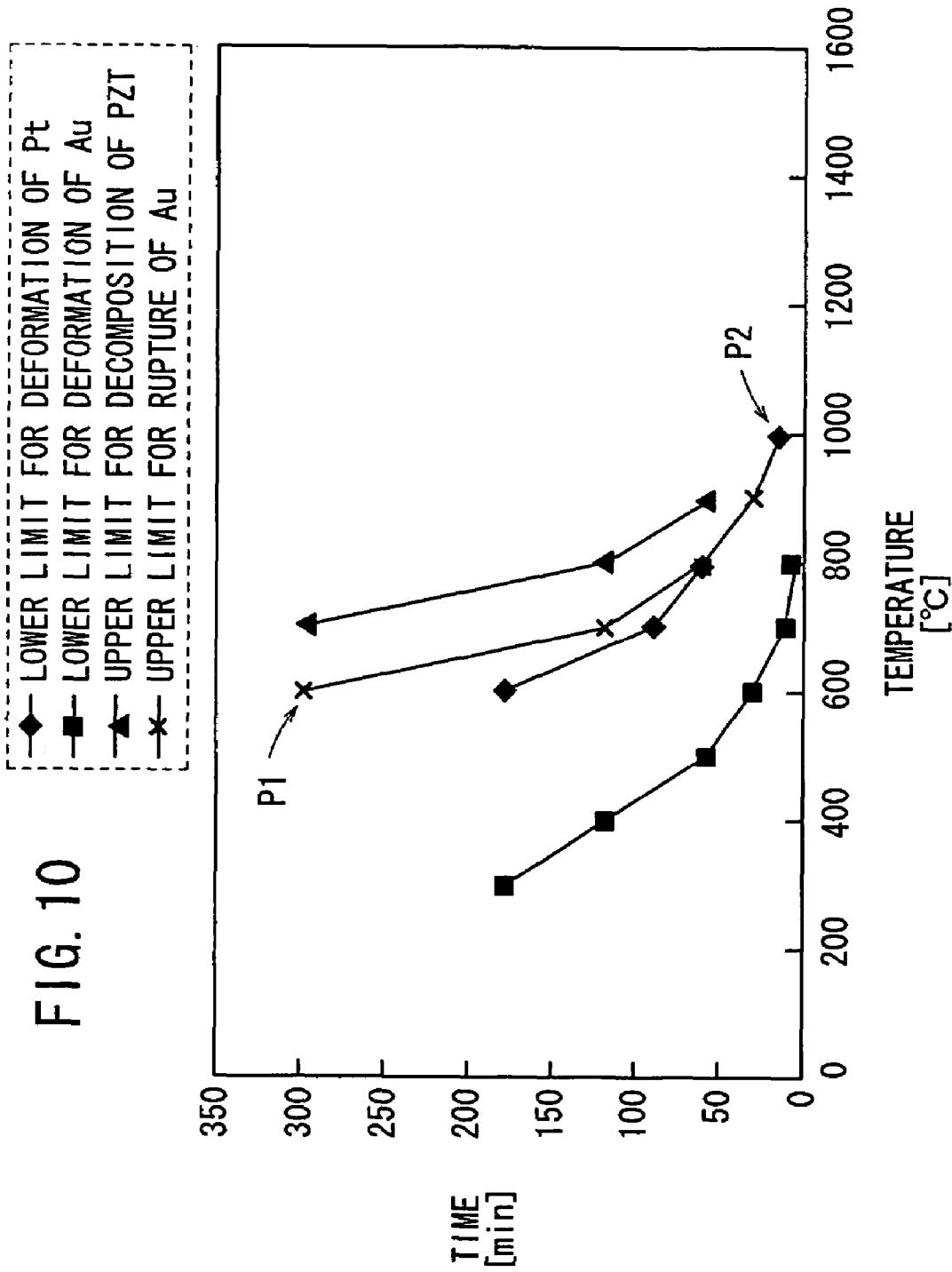
FIG. 10 is a characteristic diagram showing heat treatment conditions according to the present embodiment.

FIG. 10 shows an upper limit for the decomposition of PZT if the piezoelectric/electrostrictive layer 22 is made of PZT (lead zirconate titanate), a lower limit for the deformation of Pt if the metal material of the electrode layers 24, 26 comprises Pt, a lower limit for the deformation of Au if the metal material of the electrode layers 24, 26 comprises Au, and an upper limit for the rupture of Au.

If the metal material of the electrode layers 24, 26 comprises Pt, then the above heat treatment should preferably be performed at a heat treatment temperature for a period of time where the temperature and the period of time are indicated by an area surrounded by the lower limit for the deformation of Pt and the upper limit for the decomposition of PZT.

If the metal material of the electrode layers 24, 26 comprises Au, then the above heat treatment should preferably be performed at a heat treatment temperature for a period of time where the temperature and the period of time are indicated by an area surrounded by the lower limit for the deformation of Au and the upper limit for the rupture of Au.

An experimental example is shown below. In the experimental example, the surface states of the severed surfaces of the piezoelectric/electrostrictive elements 18a, 18b were measured by an SEM (scanning electron microscope) with respect to Inventive Examples 1, 2.

In Inventive Example 1, the piezoelectric/electrostrictive layer 22 was made of PZT, the metal material of the electrode layers 24, 26 comprised Pt, and the heat treatment conditions were a temperature of 600° C. and 5 hours. That is, the heat treatment was performed under conditions indicated at a point P1 in FIG. 10. The surface configuration of Inventive Example 1 after the heat treatment is shown in FIG. 11.

In Inventive Example 2, the piezoelectric/electrostrictive layer 22 was made of PZT, the metal material of the electrode layers 24, 26 comprised Pt, and the heat treatment conditions were a temperature of 1000° C. and 10 minutes. That is, the heat treatment was performed under conditions indicated at a point P2 in FIG. 10. The surface configuration of Inventive Example 2 after the heat treatment is shown in FIG. 12.

Figure 11:
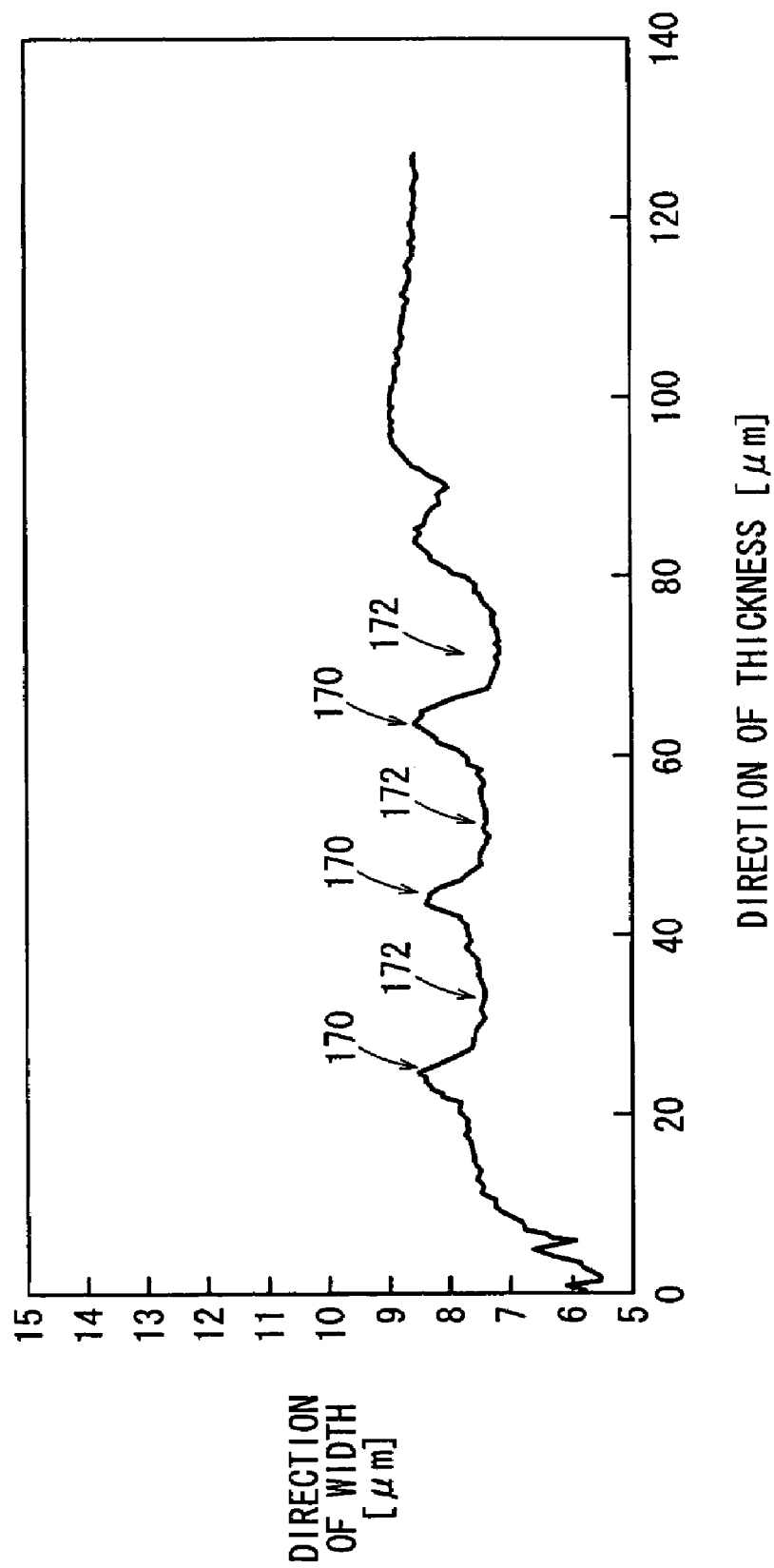
FIG. 11 is a characteristic diagram showing the shape of an end of the electrode layer and an end of the piezoelectric/electrostrictive layer in Inventive Example 1 (heat treatment conditions: 600° C., 5 hours)
Figure 12:
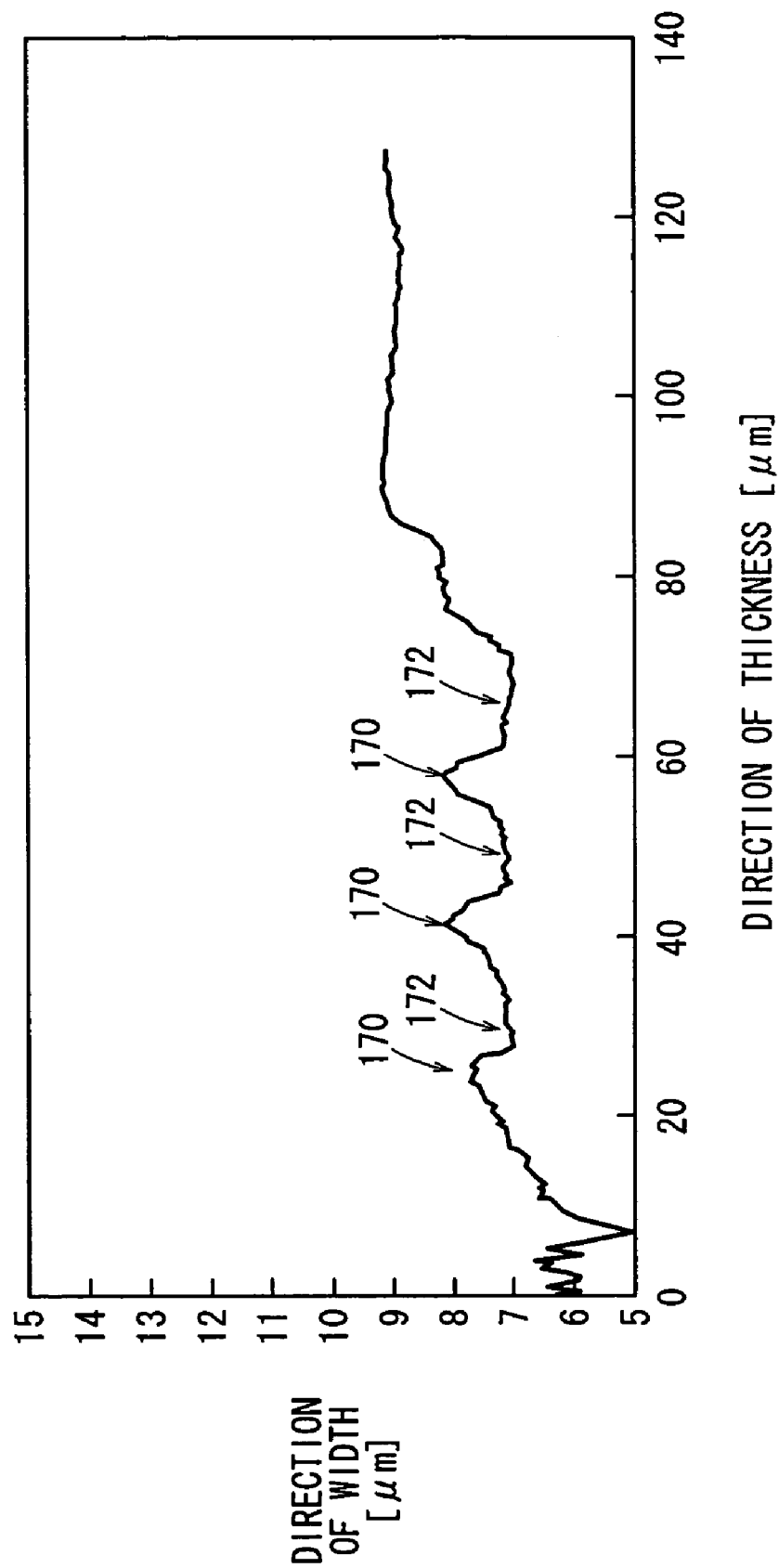
FIG. 12 is a characteristic diagram showing the shape of an end of the electrode layer and an end of the piezoelectric/electrostrictive layer in Inventive Example 1 (heat treatment conditions: 1000° C., 10 minutes)

In FIGS. 11 and 12, the horizontal axis represents the distance in the direction of the thickness (the direction toward the thin plate section 12a (and 12b)) from the tip end of the piezoelectric/electrostrictive element 18a (and 18b), and the vertical axis represents the distance in the direction of the width of the piezoelectric/electrostrictive element 18a (and 18b).

In Comparative Examples, surface states were measured when no heat treatment was performed. Depending on the timing of severance and the type of the cutting device, the ends 24a, 26a of the electrode layers 24, 26 excessively projected outwardly, the ends 24a, 26a of the electrode layers 24, 26 did not project outwardly from the end face 22a of the piezoelectric/electrostrictive layer 22, or the projecting distance t was too small. Various configurations were produced, i.e., configuration variations were produced, and no specific configurations could be identified.

Of the curves shown in FIGS. 11 and 12, protruding portions 170 represent the ends 24a, 26a of the electrode layers 24, 26 and portions 172 at the bottoms between the ends 24a, 26a of the electrode layers 24, 26 represent the end face 22a of the piezoelectric/electrostrictive layer 22. It can be seen from FIGS. 11 and 12 that the surface configurations of Inventive Examples 1, 2 are essentially not different from each other. In both Inventive Examples 1, 2, the end face 22a of the piezoelectric/electrostrictive layer 22 between the ends 24a, 26a of the electrode layers 24, 26 is deformed into a concave shape. The distance t by which the ends 24a, 26a of the electrode layers 24, 26 project is equal to or smaller than one half of the thickness Ld of the piezoelectric/electrostrictive layer 22 between the electrode layers 24, 26, and is about 1 μm.

When the piezoelectric/electrostrictive device 10 cut off from the piezoelectric/electrostrictive device block 162 is heat-treated at a heat treatment temperature for a period of time where the temperature and the period are indicated by the area surrounded by the critical curve beyond which the metal contained in the electrode layers 24, 26 is deformed and the critical curve beyond which the metal contained in the electrode layers 24, 26 is ruptured or the critical curve beyond which the piezoelectric/electrostrictive layer 22 is decomposed, the ends 24a, 26a of the heat-treated electrode layers 24, 26 project outwardly from the end face 22a of the piezoelectric/electrostrictive layer 22 on the side surface 150 where the laminated state of the piezoelectric/electrostrictive layer 22 and the electrode layers 24, 26 is exposed, and the distance t by which the ends 24a, 26a project outwardly from the end face 22a is equal to or smaller than one half of the thickness Ld of the piezoelectric/electrostrictive layer 22 between the electrode layers 24, 26.

According to the above manufacturing process, after the piezoelectric/electrostrictive element block 160 is cut off into a plurality of piezoelectric/electrostrictive elements 18a (and 18b), the piezoelectric/electrostrictive elements 18a (and 18b) are heat-treated, or after the piezoelectric/electrostrictive device block 162 is cut off into a plurality of piezoelectric/electrostrictive devices 10, the piezoelectric/electrostrictive elements 18a (and 18b) of the piezoelectric/electrostrictive devices 10 are heat-treated. Therefore, the surfaces of the electrode layers 24, 26 are smooth and free of burrs, or have reduced burrs.

Since the crystalline state of the piezoelectric/electrostrictive layer 22 is restored by the heat-treatment, microcracks produced before the heat-treatment can be essentially eliminated. Furthermore, machining strains that have remained in the machined surfaces (the cut surfaces of the piezoelectric/electrostrictive layer 22 and the electrode layers 24, 26) can be reduced. Consequently, the piezoelectric/electrostrictive elements 18a, 18b or the piezoelectric/electrostrictive device 10 has increased characteristics and reliability.

For mounting the piezoelectric/electrostrictive device 10 according to the present embodiment on various devices referred to above, it is preferable to have guides as a mounting reference. Preferable specific examples of such guides will be described below with reference to FIGS. 13 through 15.

As shown in FIG. 13, a piezoelectric/electrostrictive device 10A according to a first specific example is of essentially the same structure as the piezoelectric/electrostrictive device 10 according to the present embodiment, but differs therefrom in that the tip end portions of the thin plate sections 12a, 12b are not thicker, the fixed section 14 has recesses (cutouts) 200 defined in an inner wall thereof in the vicinity of the thin plate sections 12a, 12b, and the thin plate sections 12a, 12b have respective rear ends 210 (ends remote from tip ends 212 of the thin plate sections 12a, 12b) projecting rearwardly from a rear end face 14a of the fixed section 14. That is, two protrusions 214 are disposed on the rear end face 14a of the fixed section 14.

Since the fixed section 14 has the recesses 200, the length of the thin plate sections 12a, 12b is substantially increased for greater displacements, and the thin plate sections 12a, 12b are made more flexible for reduced electric power consumption.

End faces 214a (corresponding to the rear ends 210 of the thin plate sections 12a, 12b in this example) of the protrusions 214 serve as abutment surfaces at the time the piezoelectric/electrostrictive device 10A is mounted in place, and hence can be used as a reference for assembling the piezoelectric/electrostrictive device 10A. The protrusions 214 can also be used as a reference point for positioning the piezoelectric/electrostrictive device 10A through image processing or the like.

When the piezoelectric/electrostrictive device 10A is mounted in place by an adhesive, it can firmly be fixed in position because the area of contact is increased by the protrusions 214.

For forming the protrusions 214, the length of the ceramic green sheet 72A shown in FIG. 7 may be set to an appropriate value, or the laminated position of the ceramic green sheet 72A may be displaced relatively to the other ceramic green sheets. Generally, since ceramic green sheets can have their dimensions including length, thickness, and width machined with high accuracy, they can sufficiently provide a positioning reference as described above.

The end faces 214a of the protrusions 214 may be of a flat surface or a tapered surface, or the protrusions 214 themselves may be pointed. If the end faces 214a are of a tapered surface, then they can be held in line-to-line contact with a confronting abutment surface. If the protrusions 214 themselves are pointed, then they can be held in point-to-point contact with a confronting abutment surface. The two protrusions 214 in this example are held in contact with a confronting abutment surface at two points, allowing the piezoelectric/electrostrictive device 10A to be positioned accurately and simply.

Figure 14:
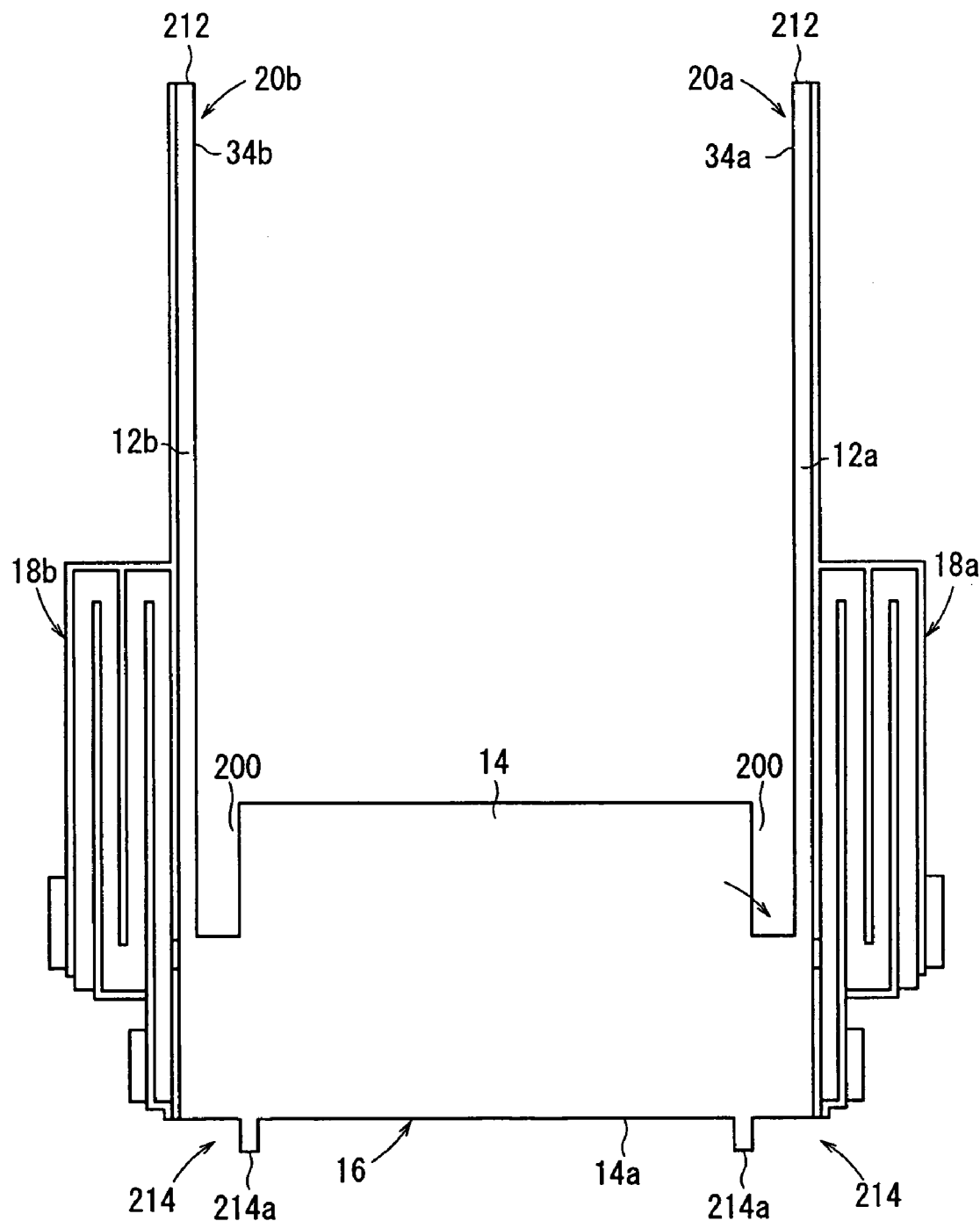
FIG. 14 is a front elevational view of a piezoelectric/electrostrictive device according to a second specific example.

The protrusions 214 may be changed in position depending on the application in which the piezoelectric/electrostrictive device is used. For example, FIG. 14 shows a piezoelectric/electrostrictive device 10B according to a second specific example. The piezoelectric/electrostrictive device 10B has two protrusions 214 disposed on the end face 14a of the fixed section 14 at positions more inward than with the piezoelectric/electrostrictive device 10A according to the first specific example. The protrusions 214 may easily be formed by changing the length of two of the ceramic green sheets 70A to 70D and the ceramic green sheets 102A to 102G shown in FIG. 7 or relatively shifting the laminated positions of those two ceramic green sheets.

Figure 15:
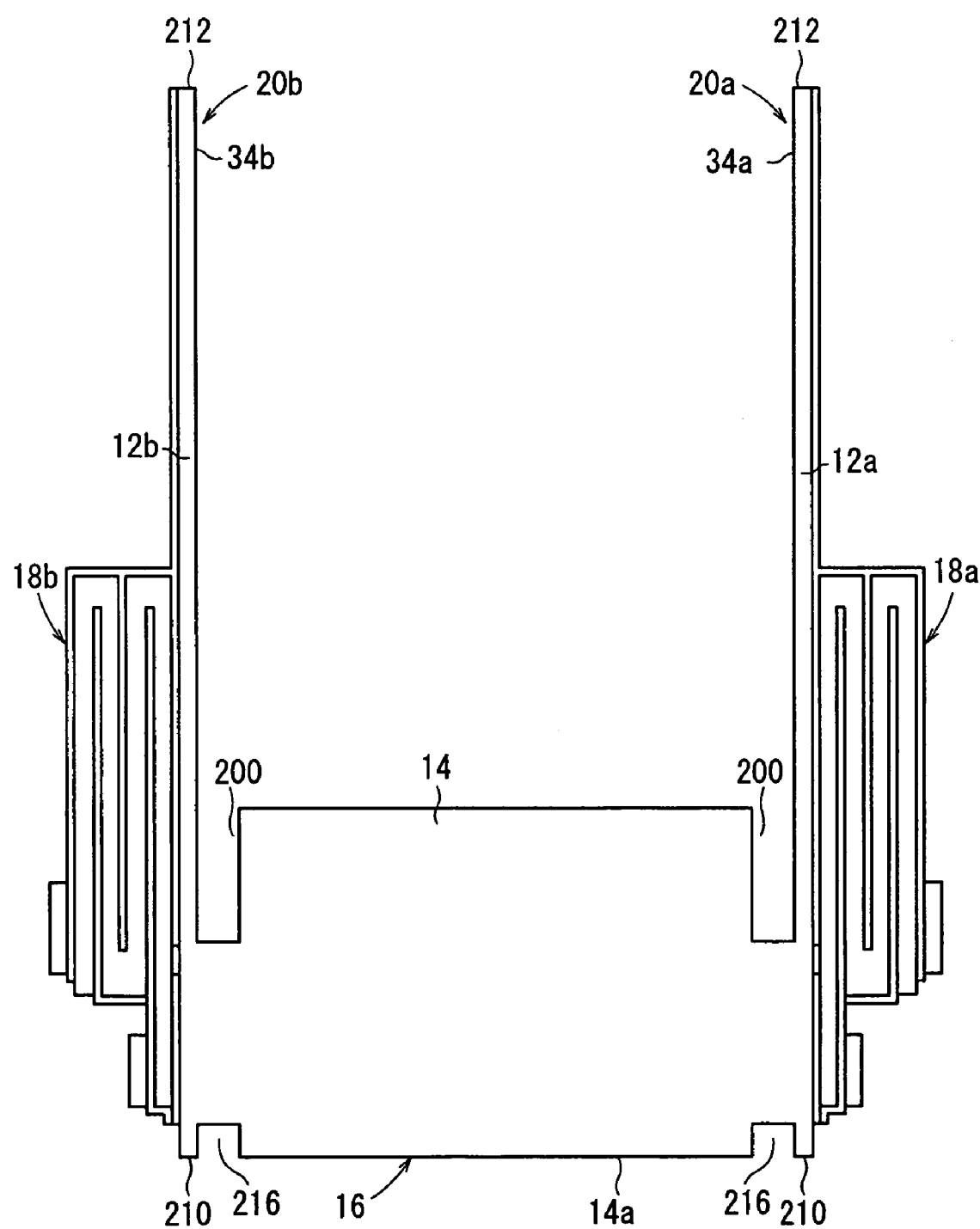
FIG. 15 is a front elevational view of a piezoelectric/electrostrictive device according to a third specific example.

FIG. 15 shows a piezoelectric/electrostrictive device 10C according to a third specific example. The piezoelectric/electrostrictive device 10C has recesses 216 defined in the end face 14a of the fixed section 14, in place of the protrusions 214. If any of various devices has two rails on a region for mounting the piezoelectric/electrostrictive device 10C thereon, then the rails may be inserted into the respective recesses 216 for thereby easily positioning the piezoelectric/electrostrictive device 10C on the device. The piezoelectric/electrostrictive device 10C can thus easily be mounted in position.

The recesses may be formed easily by changing the length of (e.g., shortening) the ceramic green sheets 70A, 70D shown in FIG. 7 or relatively shifting the laminated positions thereof.

The piezoelectric/electrostrictive devices 10, 10a, 10b, 10A, 10B, and 10C described above can be utilized as sensor elements of various sensors including ultrasonic wave sensors, acceleration sensors, angular velocity sensors, shock sensors, and mass sensors, as well as active elements including various transducers, various actuators, frequency region functional parts (filters), transformers, and vibrators, resonators, oscillators, and discriminators for communication or power generation. Especially, the piezoelectric/electrostrictive devices can be preferably utilized for various actuators in mechanisms for adjusting displacement or positions of, or mechanisms for adjusting angles of various precision components in optical instruments and precision instruments.

The piezoelectric/electrostrictive element, the method of manufacturing the piezoelectric/electrostrictive element, the piezoelectric/electrostrictive device, and the method of manufacturing the piezoelectric/electrostrictive device according to the present invention are not limited to the above embodiments, but may take various arrangements without departing from the scope of the invention.

As described above, the piezoelectric/electrostrictive element and the piezoelectric/electrostrictive device according to the present invention make it less liable to produce an electric discharge at the tip ends of electrode layers and is capable of preventing a short-circuit from forming between the electrode layers that face each other.

The method of manufacturing a piezoelectric/electrostrictive element and the method of manufacturing a piezoelectric/electrostrictive device according to the present invention are capable of easily manufacturing a piezoelectric/electrostrictive element and a piezoelectric/electrostrictive device which make it less liable to produce an electric discharge at the tip ends of electrode layers and is capable of preventing a short-circuit from forming between the electrode layers that face each other.

What is claimed is:

1. A piezoelectric/electrostrictive device comprising laminated piezoelectric/electrostrictive elements disposed on a ceramic substrate, said piezoelectric/electrostrictive elements having a structure in which a piezoelectric/electrostrictive layer and internal electrode layers are stacked in an interdigitating comb-shaped pattern, an uppermost, exposed surface of at least one of said piezoelectric/electrostrictive elements being defined at least in part by an outermost electrode layer, wherein said internal and outermost electrode layers have respective ends projecting outwardly from a side face of said piezoelectric/electrostrictive layer on a side surface at which the laminated state of said piezoelectric/electrostrictive layer and said internal electrode layers is exposed, and wherein a distance by which said ends project outwardly from said side face is equal to or smaller than one half of the thickness of said piezoelectric/electrostrictive layer between said internal electrode layers.

2. A piezoelectric/electrostrictive element according to claim 1, wherein said distance is in a range from 0.5 μm to 2 μm.

3. A piezoelectric/electrostrictive element according to claim 1, wherein said internal and external electrode layers include a cermet.

4. A piezoelectric/electrostrictive device according to claim 1, wherein said device is obtained by a cutting process after a sintering process.

5. A piezoelectric/electrostrictive device according to claim 4, wherein said respective ends projecting outwardly from said side face are obtained by a heat treatment after said cutting process.

6. A piezoelectric/electrostrictive device according to claim 5, wherein said piezoelectric/electrostrictive elements are heat treated at a heat treatment temperature for a period of time where said temperature and said period of time are indicated by an area surrounded by a critical curve beyond which a metal contained in said internal and external electrode layers is deformed and a critical curve beyond which said metal contained in said internal and external electrode layers is ruptured or a critical curve beyond which said piezoelectric/electrostrictive layer is decomposed.

7. A piezoelectric/electrostrictive device according to claim 5, wherein said heat treatment is performed at a temperature from 600 to 1000° C.

* * * * *